United States Patent
Shin et al.

(10) Patent No.: US 10,607,688 B2
(45) Date of Patent: Mar. 31, 2020

(54) MEMORY DEVICE AND OPERATING METHOD THEREOF

(71) Applicant: SK hynix Inc., Icheon-si Gyeonggi-do (KR)

(72) Inventors: Jae Hyeon Shin, Icheon-si (KR); Sung Hyun Hwang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/244,932

(22) Filed: Jan. 10, 2019

(65) Prior Publication Data

US 2019/0355408 A1   Nov. 21, 2019

(30) Foreign Application Priority Data

May 18, 2018   (KR) .................. 10-2018-0056859

(51) Int. Cl.
| | |
|---|---|
| G11C 8/08 | (2006.01) |
| G11C 11/4091 | (2006.01) |
| G11C 11/4093 | (2006.01) |
| G11C 16/34 | (2006.01) |
| G11C 11/4094 | (2006.01) |

(52) U.S. Cl.
CPC ............ *G11C 11/4091* (2013.01); *G11C 8/08* (2013.01); *G11C 11/4093* (2013.01); *G11C 11/4094* (2013.01); *G11C 16/3459* (2013.01)

(58) Field of Classification Search
CPC .................................... G11C 8/10; G11C 7/12
USPC .............................................. 365/203, 230.03
See application file for complete search history.

(56) References Cited

U.S. PATENT DOCUMENTS

| | | | | |
|---|---|---|---|---|
| 4,395,646 A | * | 7/1983 | Cases .................. | H01L 27/0883 257/E27.061 |
| 5,521,864 A | * | 5/1996 | Kobayashi ......... | G11C 16/3454 365/185.12 |
| 6,021,068 A | * | 2/2000 | Miki ...................... | G11C 16/28 365/185.2 |
| 6,181,599 B1 | * | 1/2001 | Gongwer ................ | G11C 8/08 365/185.18 |
| 6,370,052 B1 | * | 4/2002 | Hsu ........................ | G11C 15/04 365/154 |
| 6,542,401 B2 | * | 4/2003 | Yamauchi ................ | G11C 7/12 257/E27.099 |
| 6,687,175 B1 | * | 2/2004 | Mizuno .................... | G11C 7/04 365/203 |
| 6,741,517 B1 | * | 5/2004 | Fisher ...................... | G11C 8/16 365/154 |
| 2003/0169612 A1 | * | 9/2003 | Hu ........................ | G11C 15/04 365/49.17 |
| 2003/0179640 A1 | * | 9/2003 | Winograd ........... | G06F 13/4086 365/233.1 |

(Continued)

FOREIGN PATENT DOCUMENTS

KR    1020180099015 A    9/2018

*Primary Examiner* — Michael T Tran
(74) *Attorney, Agent, or Firm* — William Park & Associates Ltd.

(57) ABSTRACT

A method of operating a memory device, the method including matching a voltage of a selected word line, among word lines coupled to the plurality of memory cells, with a voltage of unselected word lines. The method including precharging a channel region of the plurality of memory cell strings through the common source line while discharging the selected word line and the unselected word lines.

20 Claims, 19 Drawing Sheets

(56) References Cited

U.S. PATENT DOCUMENTS

| | | | |
|---|---|---|---|
| 2005/0157526 A1* | 7/2005 | Hanzawa | G11C 15/04 365/49.12 |
| 2006/0018162 A1* | 1/2006 | Kawai | G11C 16/12 365/185.28 |
| 2008/0259667 A1* | 10/2008 | Wickeraad | G11C 15/04 365/49.1 |
| 2009/0141527 A1* | 6/2009 | Arsovski | G11C 15/04 365/49.17 |
| 2009/0141528 A1* | 6/2009 | Arsovski | G11C 15/04 365/49.17 |
| 2009/0231938 A1* | 9/2009 | Joo | G11C 7/12 365/203 |
| 2009/0316465 A1* | 12/2009 | Jain | G11C 7/22 365/94 |
| 2010/0208505 A1* | 8/2010 | Turier | G11C 7/02 365/94 |
| 2011/0103120 A1* | 5/2011 | Hong | G11C 15/04 365/49.17 |
| 2011/0149663 A1* | 6/2011 | Yoshida | G11C 7/04 365/194 |
| 2012/0137083 A1* | 5/2012 | Koike | G06F 12/1027 711/148 |
| 2012/0147680 A1* | 6/2012 | Koike | G11C 5/147 365/189.011 |
| 2012/0273965 A1* | 11/2012 | Seo | H01L 27/11565 257/774 |
| 2013/0194870 A1* | 8/2013 | Lee | G11C 16/26 365/185.11 |
| 2015/0003151 A1* | 1/2015 | Lee | G11C 16/10 365/185.02 |
| 2015/0179269 A1* | 6/2015 | Lee | G11C 16/14 365/185.03 |
| 2015/0200011 A1* | 7/2015 | Arsovski | G06F 11/1064 365/49.11 |
| 2015/0339222 A1* | 11/2015 | Makino | G06F 16/90339 711/108 |
| 2016/0172037 A1* | 6/2016 | Lee | G11C 15/046 365/185.12 |
| 2018/0150394 A1* | 5/2018 | Adaikkalavan | G06F 12/0808 |

* cited by examiner

FIG. 7A
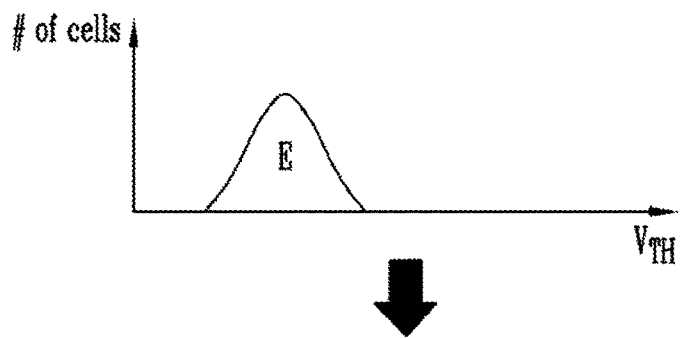
FIG. 7B
FIG. 8A
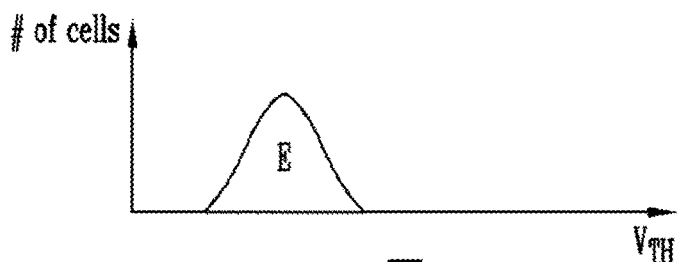
FIG. 8B
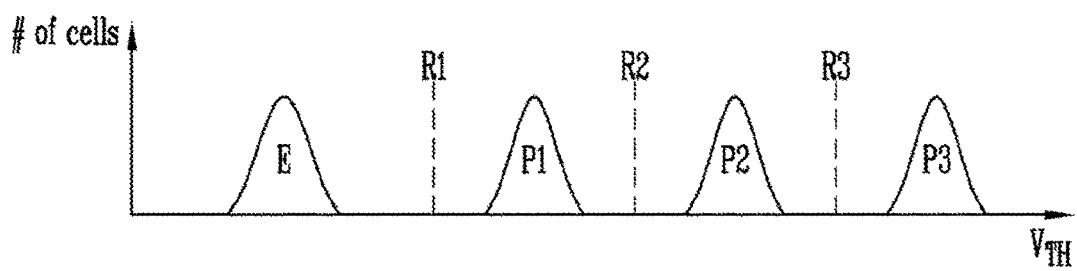

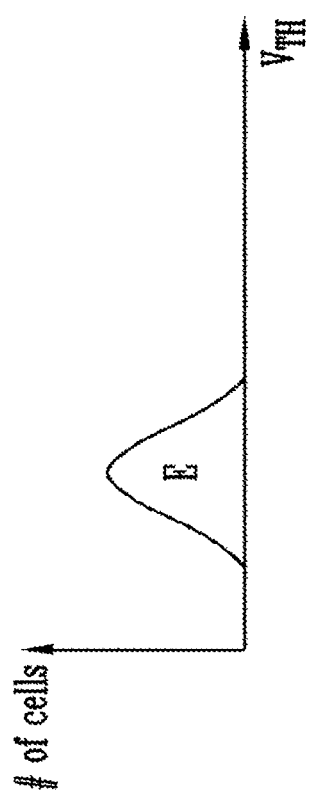
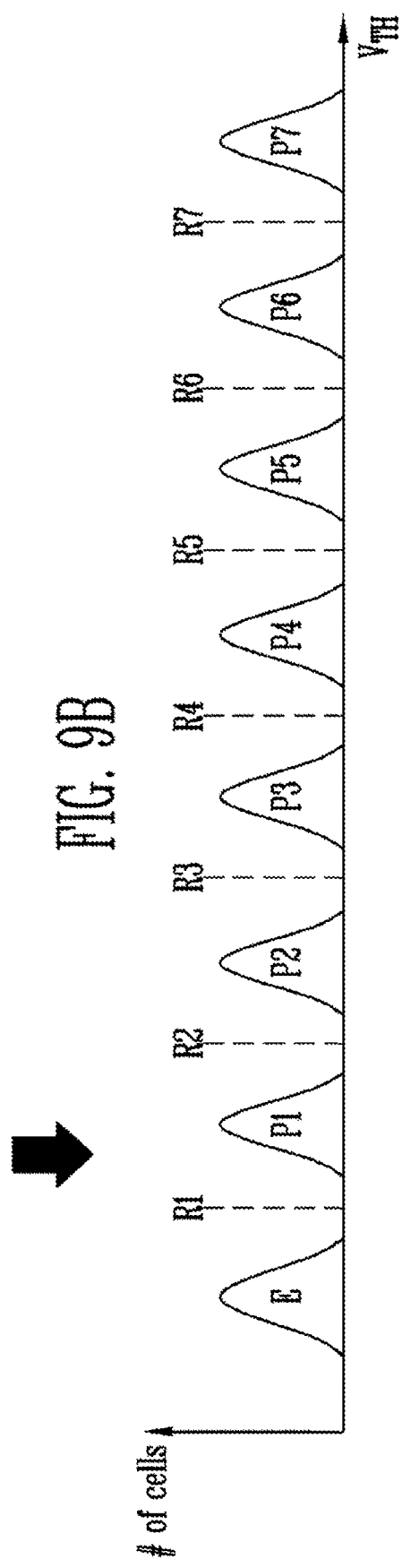

MEMORY DEVICE AND OPERATING METHOD THEREOF

CROSS-REFERENCE TO RELATED APPLICATION

The present application claims priority under 35 U.S.C. § 119(a) to Korean patent application number 10-2018-0056859, filed on May 18, 2018, in the Korean Intellectual Property Office, the entire disclosure of which is incorporated herein by reference.

BACKGROUND

1. Technical Field

Various embodiments generally relate to an electronic device, and more particularly, to a memory device and an operating method of the memory device.

2. Related Art

A memory device may be classified into a volatile memory and a nonvolatile memory. Nonvolatile memories may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and Ferroelectric RAM (FRAM).

SUMMARY

According to an embodiment, a method of operating a memory device including a plurality of memory cell strings each including a plurality of memory cells coupled between a common source line and a bit line, a source selection line coupled between the common source line and the plurality of memory cells, and a drain selection line coupled between the bit line and the plurality of memory cells may include matching a voltage of a selected word line, among word lines coupled to the plurality of memory cells, with a voltage of unselected word lines, and precharging a channel region of the plurality of memory cell strings through the common source line while discharging the selected word line and the unselected word lines.

According to an embodiment, a memory device may include a plurality of memory cell strings each including a plurality of memory cells coupled between a common source line and a bit line, a source selection line coupled between the common source line and the plurality of memory cells, and a drain selection line coupled between the bit line and the plurality of memory cells, a peripheral circuit configured to perform a plurality of program loops including a program voltage apply step for applying a program voltage to selected memory cells, among the plurality of memory cells, and a verify step for verifying program states of the selected memory cells, and a program operation controller configured to control the peripheral circuit to apply a precharge voltage to a channel region of the plurality of memory cell strings through the common source line or the bit line when a selected word line coupled to the selected memory cells and a plurality of unselected word lines coupled to unselected memory cells, which are all memory cells except for the selected memory cells, are discharged in the verify step.

BRIEF DESCRIPTION OF THE DRAWINGS

FIGS. 7A and 7B are diagrams illustrating a threshold voltage distribution of a single-level cell;

FIGS. 8A and 8B are diagrams illustrating a threshold voltage distribution of a multi-level cell;

FIGS. 9A and 9B are diagrams illustrating a threshold voltage distribution of a triple-level cell;

DETAILED DESCRIPTION

Figure 1:
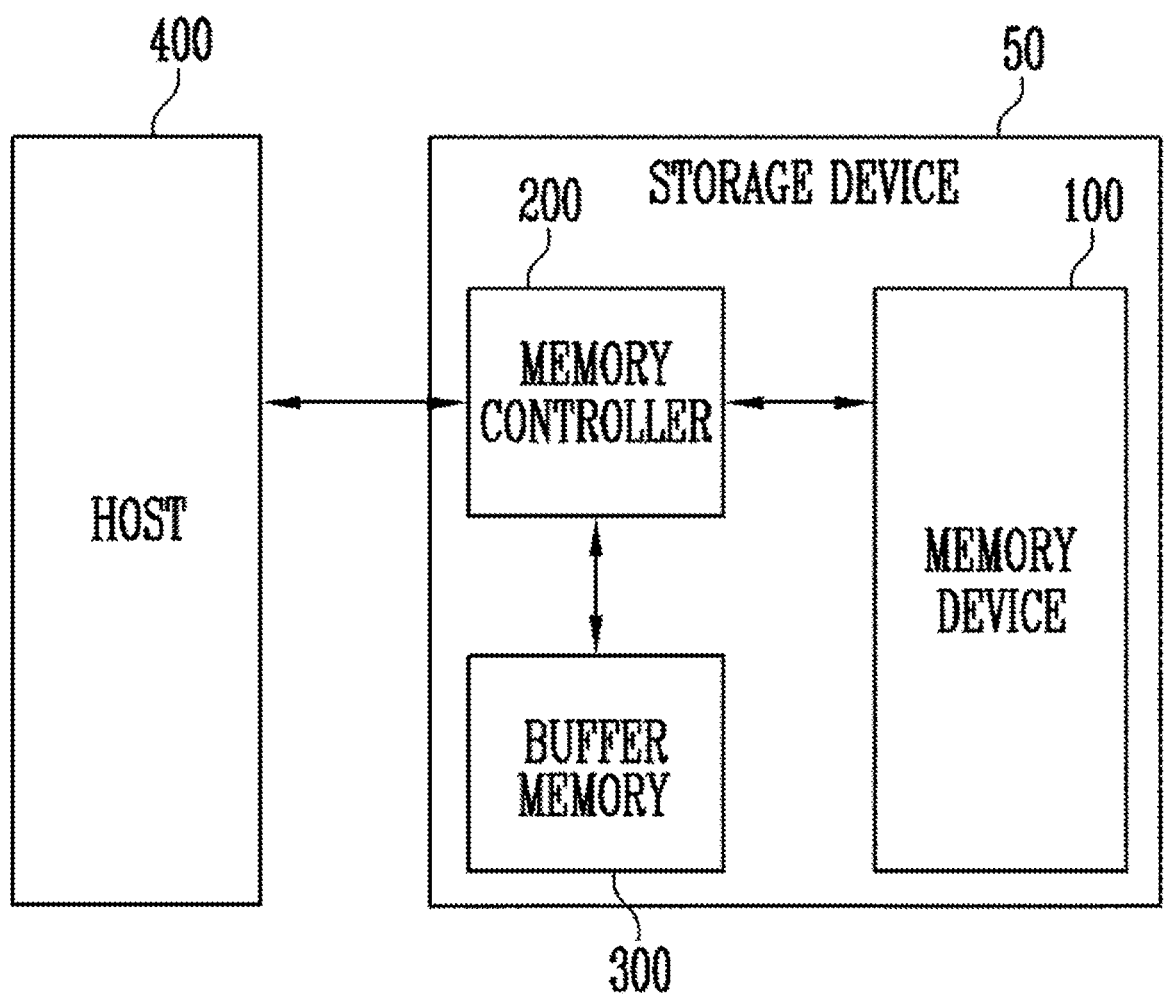
FIG. 1 is a block diagram illustrating a storage device according to an embodiment of the present disclosure.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present disclosure. This intends to disclose the gist of the present disclosure more clearly by omitting unnecessary description.

Hereinafter, examples of embodiments of the present disclosure will be described in detail with reference to the accompanying drawings in order for those skilled in the art to be able to readily implement the technical spirit of the present disclosure.

Various embodiments may be directed to a memory device having an improved program operation speed and an operating method thereof.

FIG. 1 is a block diagram illustrating a storage device 50 according to an embodiment of the present disclosure.

Referring to FIG. 1, the storage device 50 may include a memory device 100, a memory controller 200, and a buffer memory 300.

The storage device 50 may be configured to store data in response to control of a host 400, such as a cellular phone, a smartphone, an MP3 player, a laptop computer, a desktop computer, a game player, a TV, a tablet PC, or an in-vehicle infotainment system etc.

The storage device 50 may be manufactured using one of various types of storage devices according to a host interface which is a communication method with the host 400. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The storage device 50 may be manufactured in any one of various types of packages. For example, the storage device 50 may be formed in one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP), and the like.

The memory device 100 may store data. The memory device 100 may be operated under the control of the memory controller 200. The memory device 100 may include a memory cell array including a plurality of memory cells storing data. The memory cell array may include a plurality of memory blocks. Each of the memory blocks may include a plurality of memory cells. Each memory block may include a plurality of pages. According to an embodiment, a page may be a unit for storing data in the memory device 100 or for reading data stored in the memory device 100. A memory block may be a unit for erasing data. According to an embodiment, the memory device 100 may be a Double Data Rate Synchronous Dynamic Random Access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random Access Memory (RDRAM), a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM) etc. For convenience of explanation, it is assumed that the memory device 100 is a NAND flash memory.

According to an embodiment, the memory device 100 may have a three-dimensional array structure. The present disclosure may also be applied not only to a flash memory in which a charge storage layer includes a conductive floating gate (FG), but also to a charge trap flash (CTF) memory in which a charge storage layer includes an insulating layer.

According to an embodiment, each of the memory cells included in the memory device 100 may be a single-level cell (SLC) storing one data bit. Alternatively, each of the memory cells of the memory device 100 may be configured as a multi-level cell (MLC) for storing two data bits, a triple-level cell (TLC) for storing three data bits, or a quad-level cell (QLC) for storing four data bits.

The memory device 100 may receive a command and an address from the memory controller 200, and access an area in the memory cell array which is selected by the address. That is, the memory device 100 may perform an operation corresponding to the command on the area selected by the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data from the area selected by the address.

The memory controller 200 may control general operations of the memory device 50.

When power is applied to the storage device 50, the memory controller 200 may execute firmware FW. When the memory device 100 is a flash memory device, the memory controller 200 may operate firmware such as a Flash Translation Layer (FTL) for controlling communication between the host 400 and the memory device 100.

According to an embodiment, the memory controller 200 may receive data and a logical block address LBA from the host 400 and convert the logical block address LBA into a physical block address PBA indicating an address of memory cells in the memory device 100 in which data will be stored. In addition, the memory controller 200 may store a logical-physical address mapping table configuring a mapping relationship between the logical block address LBA and the physical block address PBA in the buffer memory 300.

For example, the memory controller 200 may control the memory device 100 so that a program operation, a read operation or an erase operation may be performed in response to a request from the host 400. During a program operation, the memory controller 200 may provide a program command, the physical block address PBA, and data to the memory device 100. During a read operation, the memory controller 200 may provide a read command and the physical block address PBA to the memory device 100. During an erase operation, the memory controller 200 may provide an erase command and the physical block address PBA to the memory device 100.

According to an embodiment, the memory controller 200 may autonomously generate a program command, an address, and data in the absence of a request from the host 400, and may transmit them to the memory device 100. For example, the memory controller 200 may provide a command, an address, and data to the memory device 100 to perform background operations, such as a program operation for wear leveling and a program operation for garbage collection.

According to an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store the data input from the host 400 and transmit the data temporarily stored in the buffer memory device 300 to the memory device 100.

According to various embodiments, the buffer memory 300 may serve as an operation memory or a cache memory. The buffer memory 300 may store codes or commands executed by the memory controller 200. Alternatively, the buffer memory 300 may store data processed by the memory controller 200.

According to an embodiment, the buffer memory 300 may include a dynamic random access memory (DRAM), such as Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), or Rambus Dynamic Random Access Memory (RDRAM), or a static random access memory (SRAM).

According to various embodiments, the storage device 50 may not include the buffer memory 300. However, nonvolatile memory devices outside the storage device 50 may function as the buffer memory 300.

In an embodiment, the memory controller 200 may control at least two memory devices 100. The memory controller 200 may control the memory devices 100 according to an interleaving scheme so as to improve operation performance.

The host 400 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods etc.

Figure 2:
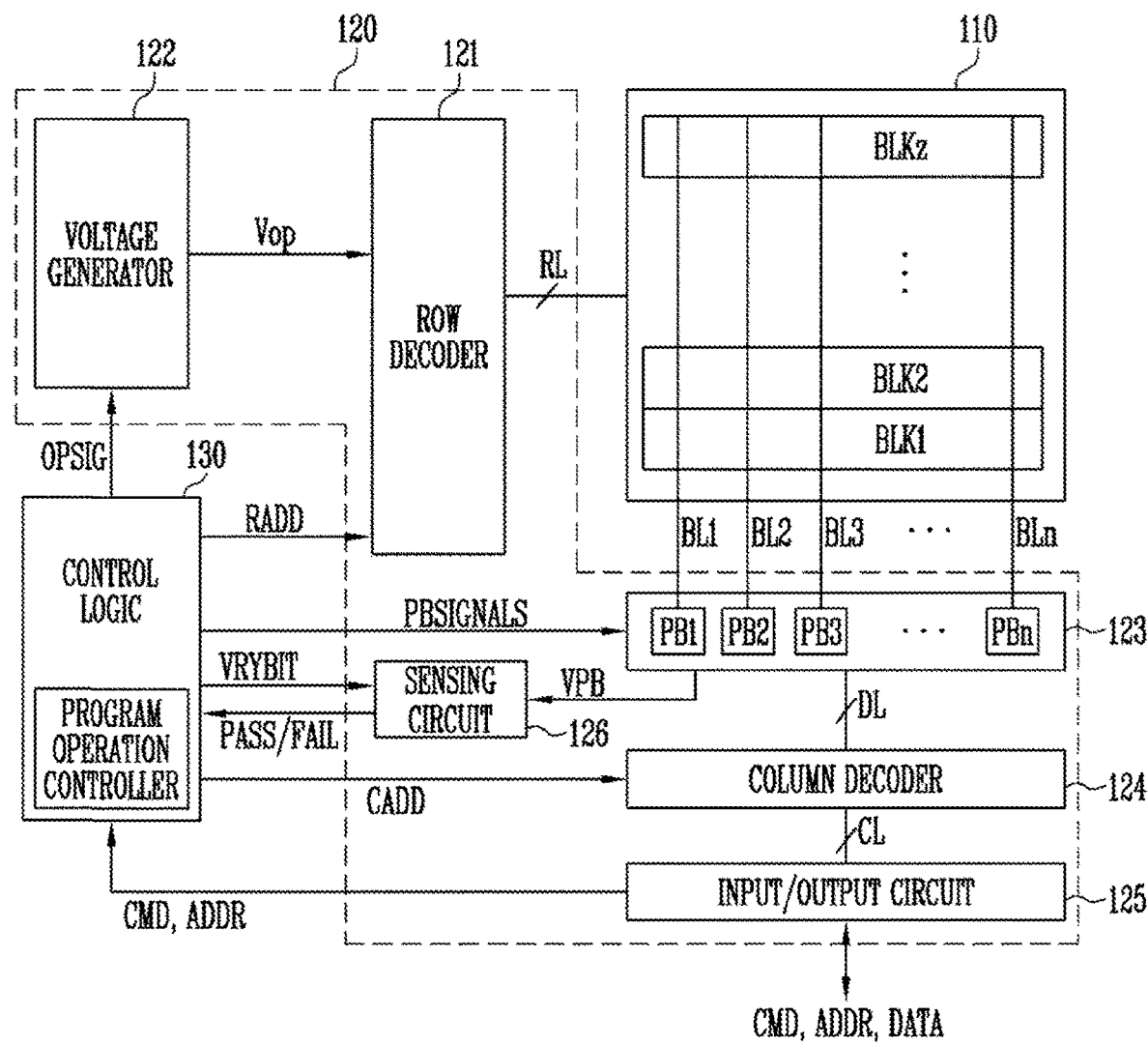
FIG. 2 is a diagram illustrating the structure of a memory device shown in FIG. 1.

FIG. 2 is a diagram illustrating the structure of the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a page buffer group 123 through bit lines BL1 to BLm. Each of the plurality of memory blocks BLK1 to BLKz may include a plurality of memory cells. In an embodiment, the plurality of memory cells may be nonvolatile memory cells. Memory cells coupled to the same word line may be defined as one page. Therefore, each memory block may include a plurality of pages.

The row lines RL may include at least one source selection line, a plurality of word lines, and at least one drain selection line.

Each of the memory cells included in the memory cell array 110 may include a single-level cell (SLC) storing a single data bit, a multi-level cell (MLC) storing two data bits, a triple-level cell (TLC) storing three data bits, or a quad-level cell (QLC) storing four data bits etc.

The peripheral circuit 120 may be configured to perform program, read and erase operations on the selected area of the memory cell array 110 in response to control of the control logic 130. The peripheral circuit 120 may drive the memory cell array 110. For example, the peripheral circuit 120 may apply various operating voltages to the row lines RL and bit lines BL1 to BLn or discharge the applied voltages in response to control of the control logic 130.

The peripheral circuit 120 may include the row decoder 121, a voltage generator 122, the page buffer group 123, a column decoder 124, and a data input/output circuit 125.

The address decoder 121 may be coupled to the memory cell array 110 through the row lines RL. The row lines RL may include at least one source selection line, a plurality of word lines, and at least one drain selection line. In an embodiment, the word lines may include normal word lines and dummy word lines. According to an embodiment, the row lines RL may further include a pipe selection line.

The row decoder 121 may be configured to operate in response to control of the control logic 130. The row decoder 121 may receive a row address RADD from the control logic 130.

The row decoder 121 may be configured to decode the row address RADD. The row decoder 121 may select at least one memory block among the memory blocks BLK1 to BLKz according to the decoded block address. The row decoder 121 may select at least one word line of the selected memory block so as to apply voltages generated by the voltage generator 122 to at least one word line according to the decoded address.

For example, during a program operation, the row decoder 121 may apply a program voltage to the selected word line and a pass voltage having a lower level than the program voltage to unselected word lines. During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

According to an embodiment, an erase operation of the memory device 100 may be performed in units of memory blocks. During an erase operation, the row decoder 121 may select one of the memory blocks according to the decoded address. During the erase operation, the address decoder 121 may apply a ground voltage to word lines coupled to the selected memory block.

The voltage generator 122 may be controlled by the control logic 130. The voltage generator 122 may be configured to generate a plurality of voltages by using an external power voltage supplied to the memory device 100. For example, the voltage generator 122 may generate various operating voltages Vop applied to perform program, read and erase operations in response to an operation signal OPSIG. For example, the voltage generator 122 may generate a program voltage, a verify voltage, a pass voltage, a read voltage, and an erase voltage in response to the control of the control logic 130.

According to an embodiment, the voltage generator 122 may generate an internal power voltage by regulating an external power voltage. The internal power voltage generated by the voltage generator 122 may serve as an operating voltage of the memory device 100.

According to an embodiment, the voltage generator 122 may generate a plurality of voltages by using the external power voltage or the internal power voltage.

For example, the voltage generator 122 may include a plurality of pumping capacitors receiving the internal power voltage, and may generate a plurality of voltages by selectively activating the plurality of pumping capacitors in response to the control of the control logic 130.

The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLm, respectively. The first to nth page buffers PB1 to PBn may operate in response to the control of the control logic 130. For example, the first to nth page buffers PB1 to PBn may operate in response to page buffer control signals PBSIGNALS. For example, the first to nth page buffers PB1 to PBn may temporarily store data received through the bit lines BL1 to BLn, or may sense voltages or currents in the bit lines BL1 to BLn For example, during a program operation, the first to nth page buffers PB1 to PBn may transfer data DATA received through the data input/output circuit 125 to selected memory cells through the first to nth bit lines BL1 to BLn when a program pulse is applied to a selected word line. The memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained. During a program verify operation, the first to nth page buffers PB1 to PBn may read page data from the selected memory cells through the first to nth bit lines BL1 to BLn.

During a read operation, the first to nth page buffers PB1 to PBn may read the data DATA from the memory cells through the first to nth bit lines BL1 to BLn and output the read data DATA to the data input/output circuit 125 in response to control of the column decoder 124.

During an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through column lines CL.

The input/output circuit 125 may transfer the command CMD and the address ADD received from the memory controller 200 as described above with reference to FIG. 1 to the control logic 130, or may exchange the data DATA with the column decoder 124.

A sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS and the allowable bit signal VRYBIT to control the peripheral circuit 120 in response to the command CMD and the address ADD. In addition, the control logic 130 may determine whether a verify operation passes or fails in response to the pass or fail signal PASS or FAIL.

Figure 3:
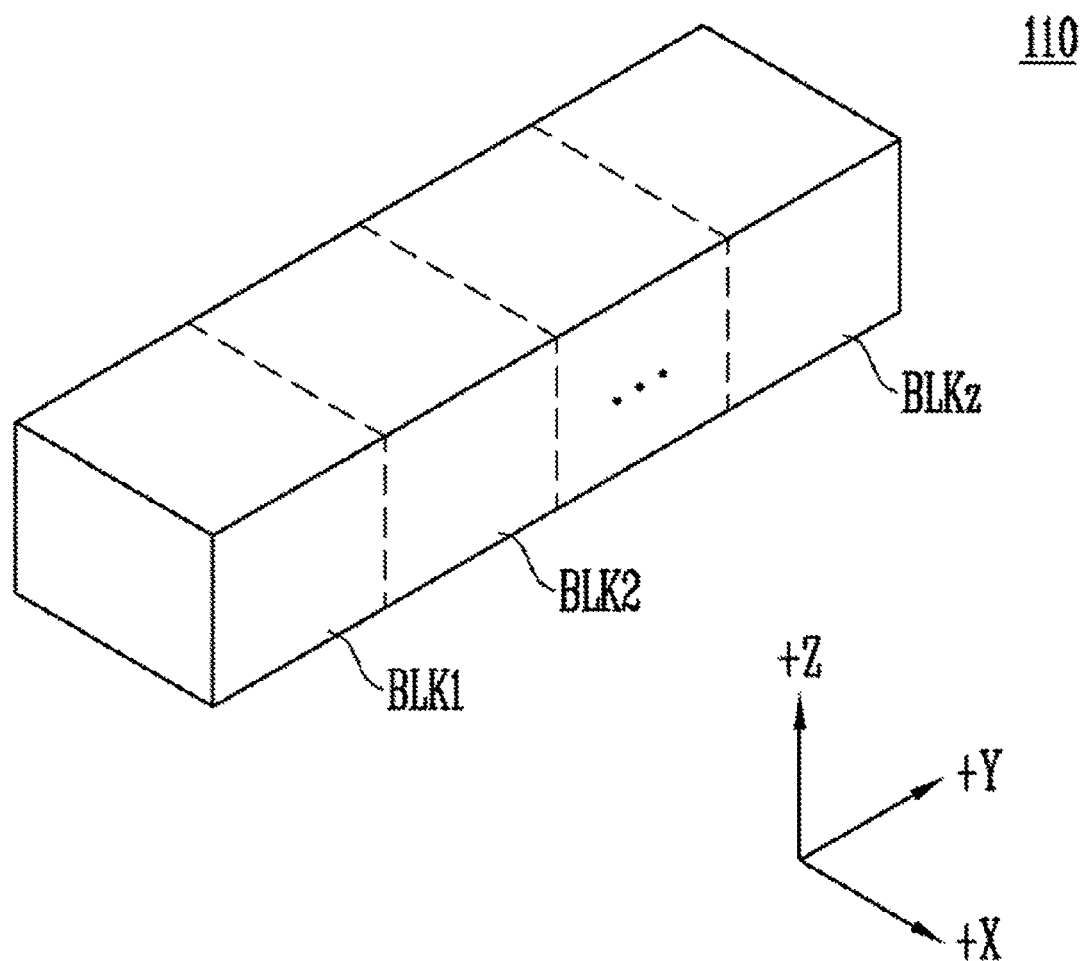
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include the plurality of memory blocks BLK1 to BLKz. Each of the memory blocks BLK1 to BLKz may include a three-dimensional structure. Each memory block may include a plurality of memory cells stacked on a substrate. The plurality of memory cells may be arranged in the +X direction, the +Y direction and the +Z direction. The structure of each memory block will be described in detail below with reference to FIGS. 4 and 5.

Figure 4:
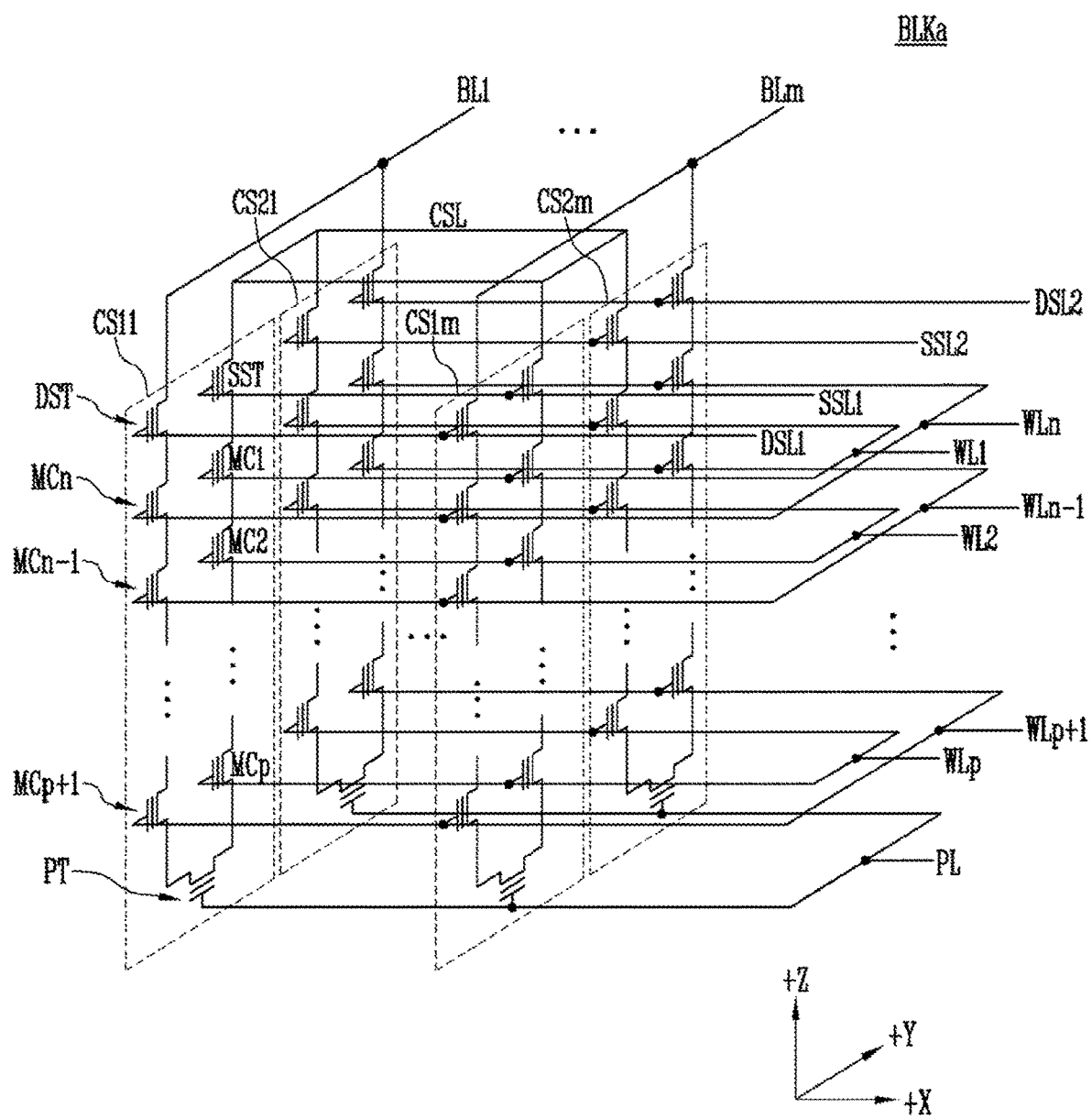
FIG. 4 is a circuit diagram illustrating one memory block BLKa among memory blocks BLK1 to BLKz shown in FIG. 3.

FIG. 4 is a circuit diagram illustrating one (BLKa) of the memory blocks BLK1 to BLKz shown in FIG. 3.

Referring to FIG. 4, the memory block BLKa may include a plurality of cell strings CS11 to CS1$m$ and CS21 to CS2$m$. According to an embodiment, each of the cell strings CS11 to CS1$m$ and CS21 to CS2$m$ may be formed in a U shape. In the memory block BLKa, 'm' cell strings may be arranged in a row direction (i.e., +X direction). In FIG. 4, it is illustrated that two cell strings are arranged in a column direction (i.e., +Y direction). However, it is understood that three or more cell strings may be arranged in the column direction.

Each of the cell strings CS11 to CS1m and CS21 to CS2m may include at least one source selection transistor SST, first to nth memory cells MC1 to MCn, a pipe transistor PT, and at least one drain selection transistor DST.

Each of the selection transistors SST and DST and each of the memory cells MC1 to MCn may have similar structures to each other. According to an embodiment, each of the selection transistors SST and DST and the memory cells MC1 to MCn may include a channel layer, a tunneling insulating layer, a charge storage layer, and a blocking insulating layer. According to an embodiment, a pillar for providing the channel layer may be provided in each cell string. According to an embodiment, a pillar for providing at least one of the channel layer, the tunneling insulating layer, the charge storage layer, and the blocking insulating layer may be provided in each cell string.

The source selection transistor SST of each cell string may be coupled between a common source line CSL and memory cells MC1 to MCp.

According to an embodiment, source selection transistors of cell strings arranged in the same row may be coupled to a source selection line extending in the row direction, and source selection transistors of cell strings arranged in different rows may be coupled to different source selection lines. In FIG. 4, source selection transistors of the cell strings CS11 to CS1m in the first row may be coupled to a first source selection line SSL1. Source selection transistors of the cell strings CS21 to CS2m in the second row may be coupled to a second source selection line SSL2.

According to an embodiment, the source selection transistors of the cell strings CS11 to CS1m and CS21 to CS2m may be coupled in common to one source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source selection transistor SST and the pipe transistor PT. The (p+1)th to nth memory cells MCp+1 to MCn may be sequentially arranged in the +Z direction and may be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in the row direction may be coupled to a drain selection line extending in the row direction. Drain selection transistors of the cell strings CS11 to CS1m in the first row may be coupled to a first drain selection line DSL1. Drain selection transistors of the cell strings CS21 to CS2m in the second row may be coupled to a second drain selection line DSL2.

Cell strings arranged in the column direction may be coupled to a bit line extending in the column direction. As illustrated in FIG. 4, the cell strings CS11 and CS21 in the first column may be coupled to the first bit line BL1. The cell strings CS1m and CS2m in the mth column may be coupled to the mth bit line BLm.

Memory cells coupled to the same word line arranged in cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the drain selection lines DSL1 and DSL2 is selected, cell strings arranged in one row direction may be selected. When one of the first to nth word lines WL1 to WLn is selected, one page may be selected from selected cell strings.

In an embodiment, even bit lines and odd bit lines may be provided instead of the first to mth bit lines BL1 to BLm. In addition, even cell strings of the cell strings CS11 to CS1m or CS21 to CS2m arranged in the row direction may be coupled to the even bit lines, respectively, and odd cell strings of the cell strings CS11 to CS1m or CS21 to CS2m arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source selection transistor SST and the memory cells MC1 to MCp. Alternatively, one or more dummy memory cells may be provided to reduce an electric field between the drain selection transistor DST and the memory cells MCp+1 to MCn. When more dummy memory cells are provided, the operational reliability of the memory block BLKa may increase, whereas the size of the memory block BLKa may increase. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
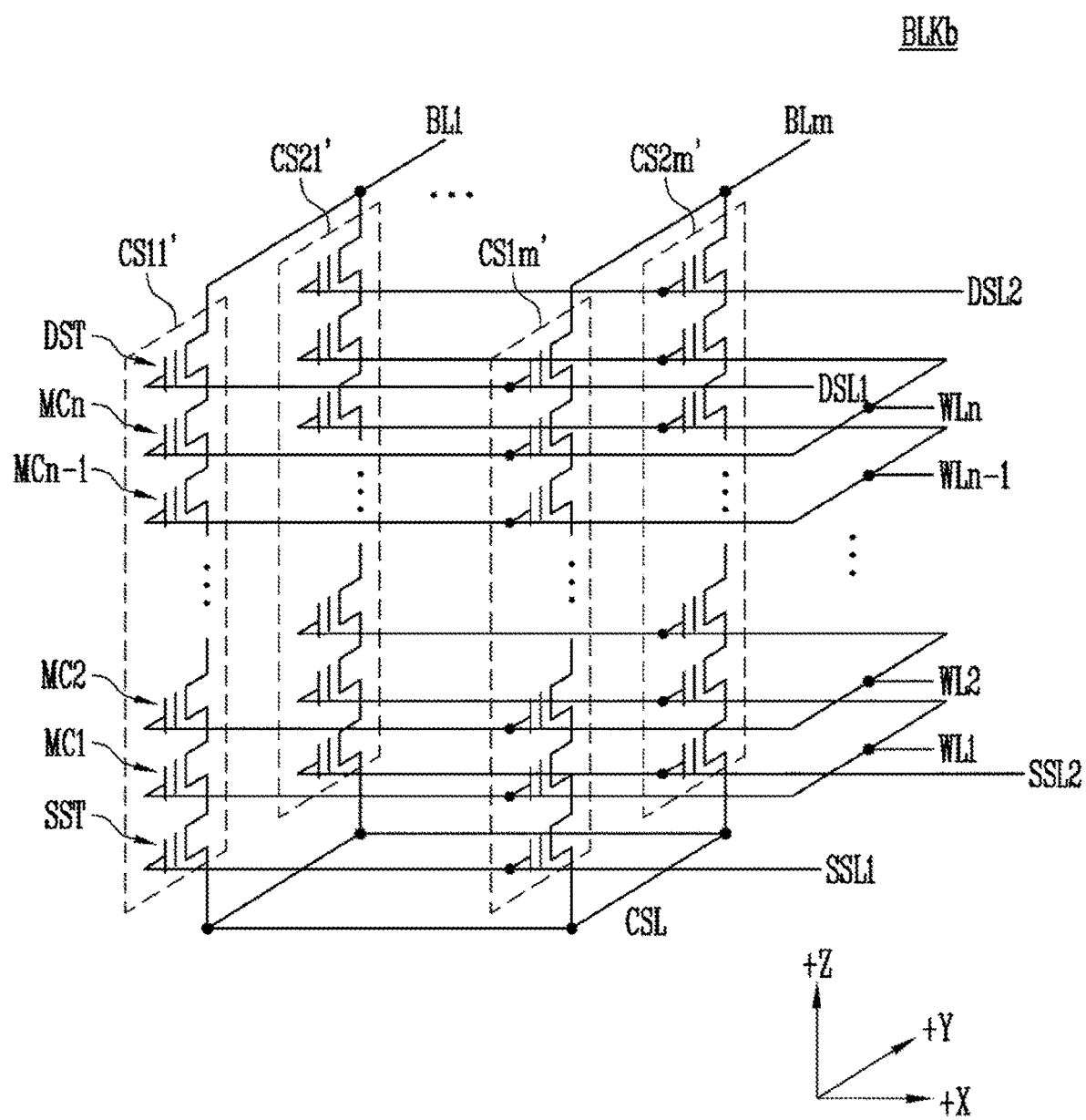
FIG. 5 is a circuit diagram illustrating other embodiments of one memory block BLKb among memory blocks BLK1 to BLKz shown in FIG. 3.

FIG. 5 is a circuit diagram illustrating an embodiment of the memory block BLKb, among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' may extend in the +Z direction. Each of the plurality of cell strings CS11' to CS1m' and CS21' to CS2m' may include at least one source selection transistor SST, the first to nth memory cells MC1 to MCn, and at least one drain selection transistor DST which are stacked on a substrate (not shown) under a memory block BLK1'.

The source selection transistor SST of each cell string may be coupled between the common source line CSL and the first to nth memory cells MC1 to MCn. Source selection transistors of cell strings arranged in the same row may be coupled to the same source selection line. Source selection transistors of the cell strings CS11' to CS1m' arranged in the first row may be coupled to a first source selection line SSL1. Source selection transistors of the cell strings CS21' to CS2m' arranged in the second row may be coupled to a second source selection line SSL2. According to an embodiment, the source selection transistors of the cell strings CS11' to CS1m' and CS21' to CS2m' may be coupled in common to one source selection line.

The first to nth memory cells MC1 to MCn of each cell string may be coupled between the source selection transistor SST and the drain selection transistor DST. Gates of the first to nth memory cells MC1 to MCn may be coupled to the first to nth word lines WL1 to WLn, respectively.

The drain selection transistor DST of each cell string may be coupled between the corresponding bit line and the memory cells MC1 to MCn. Drain selection transistors of cell strings arranged in the row direction may be coupled to a drain selection line extending in the row direction. Drain selection transistors of the cell strings CS11' to CS1m' in the first row may be coupled to a first drain selection line DSL1. Drain selection transistors of the cell strings CS21' to CS2m' in the second row may be coupled to a second drain selection line DSL1.

As a result, the memory block BLKb shown in FIG. 5 may have a similar equivalent circuit to the memory block BLKa shown in FIG. 4 except that the pipe transistor PT is removed from each cell string of the memory block BLKb.

According to an embodiment, even bit lines and odd bit lines may replace the first to mth bit lines BL1 to BLm. In addition, even cell strings of the cell strings CS11' to CS1m' or CS21' to CS2m' arranged in the row direction may be coupled to the even bit lines, respectively, and odd cell strings of the cell strings CS11' to CS1m' or CS21' to CS2m' arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source selection transistor SST and the first to nth memory cells MC1 to MCn. Alternatively, one or more dummy memory cells may be provided to reduce an electric field between the drain selection transistor DST and the memory cells MC1 to MCn. When more dummy memory cells are provided, the operational reliability of the memory block BLKb may increase, whereas the size of the memory block BLKb may increase. On the other hand, when the number of dummy memory cells decreases, the size of the memory block BLKb may be reduced, and the operational reliability of the memory block BLKb may be reduced.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 6:
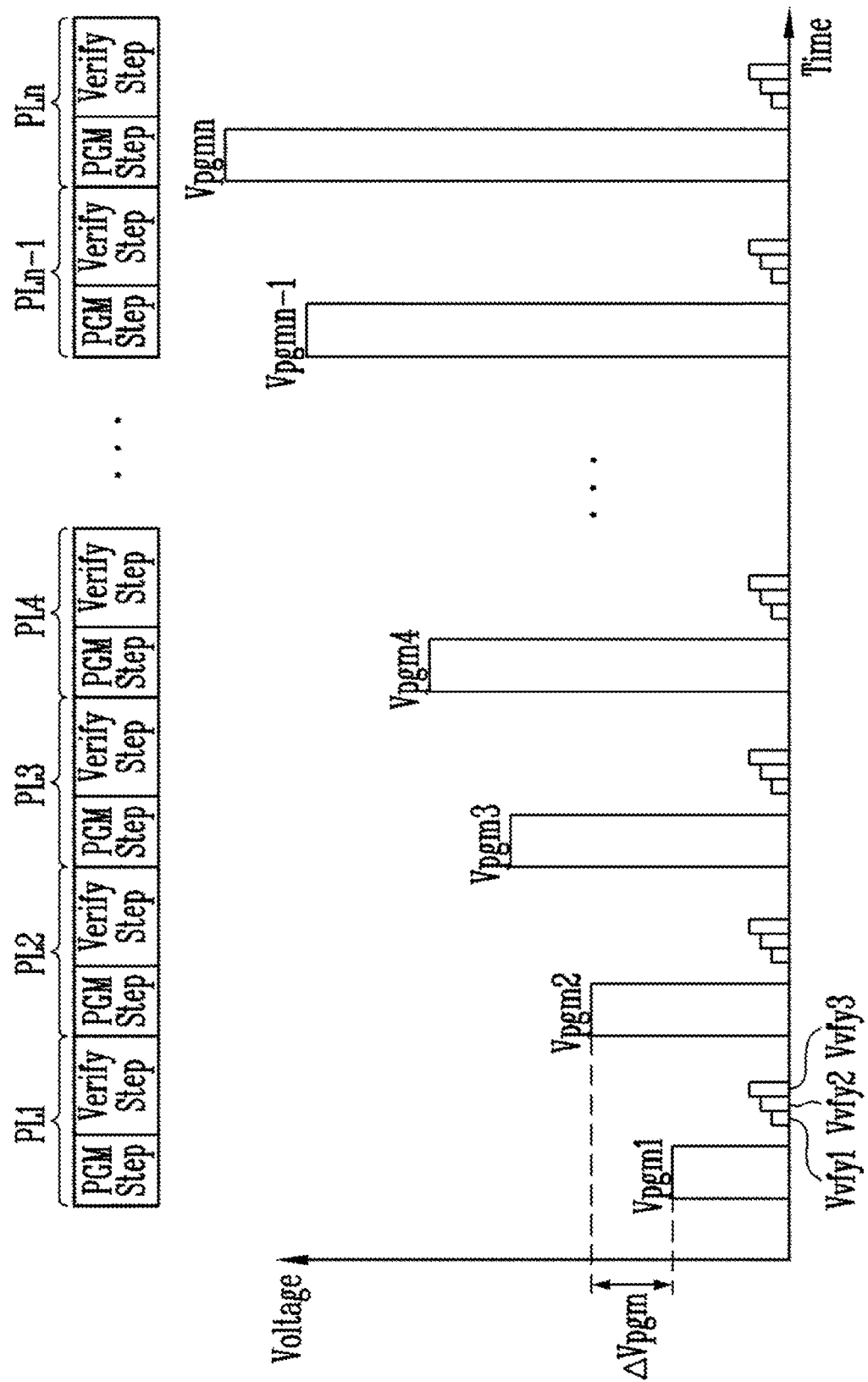
FIG. 6 is a diagram illustrating a program operation of a memory device shown in FIG. 2.

FIG. 6 is a diagram illustrating a program operation of the memory device 100 shown in FIG. 2.

In FIG. 6, for convenience of explanation, it may be assumed that each of the memory cells is a multi-level cell (MLC) storing two-bit data. However, the embodiments are not limited thereto, and each of the memory cells may be a triple-level cell (TLC) storing 3-bit data, or a quad-level cell (QLC) storing 4-bit data etc.

A program operation of the memory device 100 may include a plurality of program loops PL1 to PLn. In other words, the memory device 100 may perform the plurality of program loops PL1 to PLn so that the selected memory cells may be programmed to have a threshold voltage corresponding to one of program states P1, P2, and P3.

Each of the plurality of program loops PL1 to PLn may include a program voltage apply step (PGM Step) in which a program voltage is applied and a verify step (Verify Step) in which verify voltages are applied so as to determine whether memory cells are programmed.

For example, when the first program loop PL1 is performed, first to third verify voltages Vvfy1 to Vvfy3 may be sequentially applied to verify program states of a plurality of memory cells after a first program pulse Vpgm1 is applied. Memory cells having the first program state P1 as a target program state may be verified by the first verify voltage Vvfy1. Memory cells having the second program state P2 as a target program state may be verified by the second verify voltage Vvfy2. Memory cells having the third program state P3 as a target program state may be verified by the third verify voltage Vvfy3.

Memory cells determined as verify pass by the first to third verify voltages Vvfy1 to Vvfy3 may be determined to have the target program states. These memory cells may be program-inhibited in the subsequent second program loop PL2. To program the remaining memory cells, except for the program-inhibited memory cells, in the second program loop PL2, a second program pulse Vpgm2 greater than the first program pulse Vpgm1 by a unit voltage A Vpgm may be applied. Subsequently, a verify operation may be performed in the same manner as the verify operation of the first program loop PL1. For example, the verify pass may indicate that a memory cell is read as an off-cell by a corresponding verify voltage.

As described above, when the memory device 100 programs the multi-level cell (MLC) storing the 2-bit data, the memory device 100 may verify each of the memory cells having the respective program states as the target program states by using the first to third verify voltages Vvfy1 to Vvfy3.

During a verify operation, a verify voltage may be applied to a selected word line which is a word line coupled to selected memory cells, and a page buffer may determine verify pass of each of the memory cells on the basis of a current or a voltage flowing through bit lines coupled to the selected memory cells.

FIGS. 7A and 7B are diagrams illustrating a threshold voltage distribution of a single-level cell.

Referring to FIGS. 7A and 7B, a horizontal axis refers to a threshold voltage of a memory cell and a vertical axis refers to the number of memory cells.

A memory device may perform a program operation in units of word lines. A plurality of memory cells coupled to one word line may form one physical page. A physical page may be the unit of a program operation or a read operation.

The memory device may program memory cells coupled to a selected word line, among a plurality of word lines, according to data to be stored.

Selected memory cells which correspond to the memory cells coupled to the selected word line may have a threshold voltage distribution corresponding to an erase state E prior to a program operation as shown in FIG. 7A.

When a memory cell stores data corresponding to one bit, the memory cell may be programmed to have a threshold voltage corresponding to the erase state E or a first program state P1.

The erase state E may correspond to data '1' and the first program state P1 may correspond to data '0'. However, the data corresponding to the first program state P1 may be shown as an example. The erase state E may correspond to data '0' and the first program state P1 may correspond to data '1'.

When the program operation is completed, each of the selected memory cells may have a threshold voltage corresponding to the erase state E or the first program state P1. The memory device may read data stored in the selected memory cells by performing a read operation using a first read voltage R1 between the erase state E and the first program state P1.

FIGS. 8A and 8B are diagrams illustrating a threshold voltage distribution of a multi-level cell.

Referring to FIGS. 8A and 8B, a horizontal axis refers to a threshold voltage of a memory cell and a vertical axis refers to the number of memory cells.

Selected memory cells which correspond to memory cells coupled to a selected word line may have a threshold voltage distribution corresponding to the erase state E prior to a program operation as shown in FIG. 8A.

When a memory cell stores data corresponding to two bits, the memory cell may be programmed to have a threshold voltage corresponding to one of the erase state E, the first program state P1, a second program state P2, and a third program state P3.

The erase state E may correspond to data '11', the first program state P1 may correspond to data '10', the second program state P2 may correspond to data '00', and the third program state P3 may correspond to data '01'. However, the data corresponding to each program state may be shown as example, and various modifications may be made.

When the program operation is completed, each of the selected memory cells may have a threshold voltage corresponding to one of the erase state E, the first program state P1, the second program state P2, and the third program state P3 as shown in FIG. 8B. The memory device may read data stored in the selected memory cells by performing a read operation using the first read voltage R1 and second and third read voltages R2 and R3.

The first read voltage R1 may distinguish the erase state E from the first program state P1, the second read voltage R2 may distinguish the first program state P1 from the second program state P2, and the third read voltage R3 may distinguish the second program state P2 from the third program state P3.

FIGS. 9A and 9B are diagrams illustrating a threshold voltage distribution of a triple-level cell.

Referring to FIGS. 9A and 9B, a horizontal axis refers to a threshold voltage of a memory cell and a vertical axis refers to the number of memory cells.

Selected memory cells which correspond to memory cells coupled to a selected word line may have a threshold voltage distribution corresponding to the erase state E prior to a program operation as shown in FIG. 9A.

When a memory cell stores data corresponding to three bits, the memory cell may be programmed to have a threshold voltage corresponding to one of the erase state E, the first program state P1, the second program state P2, the third program state P3, a fourth program state P4, a fifth program state P5, a sixth program state P6, and a seventh program state P7.

The erase state E may correspond to data '111', the first program state P1 may correspond to data '110', the second program state P2 may correspond to data '101', the third program state P3 may correspond to data '100', the fourth program state P4 may correspond to data '011', the fifth program state P5 may correspond to data '010', the sixth program state P6 may correspond to data '001', and the seventh program state P7 may correspond to data '000'. However, the data corresponding to each program state may be shown as example, and various modifications may be made.

When a program operation is completed, each of the selected memory cells may have a threshold voltage corresponding to one of the erase state E, the first program state P1, the second program state P2, the third program state P3, the fourth program state P4, the fifth program state P5, the sixth program state P6, and the seventh program state P7. The memory device may read data stored in the selected memory cells by performing a read operation using the first to seventh read voltages R1 to R7.

The first read voltage R1 may distinguish the erase state E from the first program state P1, the second read voltage R2 may distinguish the first program state P1 from the second program state P2, the third read voltage R3 may distinguish the second program state P2 from the third program state P3, a fourth read voltage R4 may distinguish the third program state P3 from the fourth program state P4, a fifth read voltage R5 may distinguish the fourth program state P4 from the fifth program state P5, a sixth read voltage R6 may distinguish the fifth program state P5 from the sixth program state P6, and a seventh read voltage R7 may distinguish the sixth program state P6 from the seventh program state P7.

Figure 10A:
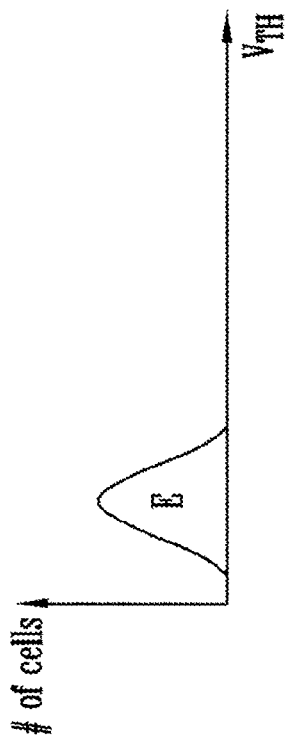
FIGS. 10A and 10B are diagrams illustrating a threshold voltage distribution of a quad-level cell.
Figure 10B:
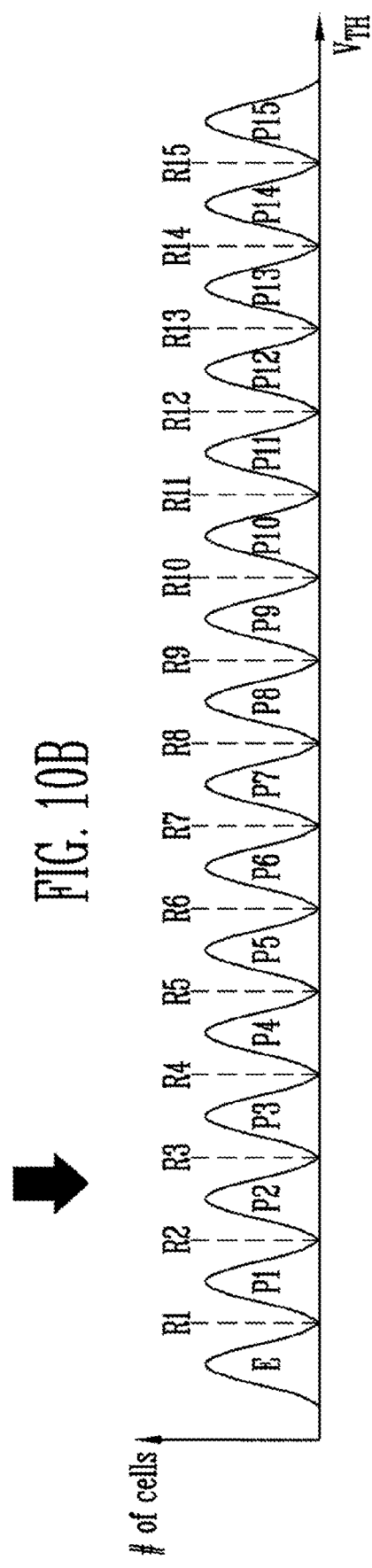

FIGS. 10A and 10B are diagrams illustrating a threshold voltage distribution of a quad-level cell.

Referring to FIGS. 10A and 10B, a horizontal axis refers to a threshold voltage of a memory cell and a vertical axis refers to the number of memory cells.

Selected memory cells which correspond to memory cells coupled to a selected word line may have a threshold voltage distribution corresponding to the erase state E prior to a program operation as shown in FIG. 10A.

When a memory cell stores data corresponding to four bits, the memory cell may be programmed to have a threshold voltage corresponding to one of the erase state E and the first to fifteenth program states P1 to P15.

The erase state E may correspond to data '1111', the first program state P1 may correspond to data '1110', the second program state P2 may correspond to data '1101', the third program state P3 may correspond to data '1100', the fourth program state P4 may correspond to data '1011', the fifth program state P5 may correspond to data '1010', the sixth program state P6 may correspond to data '1001', and the seventh program state P7 may correspond to data '1000'. In addition, an eighth erase state P8 may correspond to data '0111', a ninth program state P9 may correspond to data '0110', a tenth program state P10 may correspond to data '0101', an eleventh program state P11 may correspond to data '0100', a twelfth program state P12 may correspond to data '0011', a thirteenth program state P13 may correspond to data '0010', a fourteenth program state P14 may correspond to data '0001', and a fifteenth program state P15 may correspond to data '0000'. However, the data corresponding to each program state may be shown as example, and various modifications may be made.

When the program operation is completed, each of the selected memory cells may have a threshold voltage corresponding to the erase state E or the first to fifteenth program states P1 to P15. The memory device may read data stored in the selected memory cells by performing a read operation using the first to fifteenth read voltages R1 to R15.

The first read voltage R1 may distinguish the erase state E from the first program state P1, the second read voltage R2 may distinguish the first program state P1 from the second program state P2, the third read voltage R3 may distinguish the second program state P2 from the third program state P3, the fourth read voltage R4 may distinguish the third program state P3 from the fourth program state P4, the fifth read voltage R5 may distinguish the fourth program state P4 from the fifth program state P5, the sixth read voltage R6 may distinguish the fifth program state P5 from the sixth program state P6, the seventh read voltage R7 may distinguish the sixth program state P6 from the seventh program state P7, an eighth read voltage R8 may distinguish the seventh program state P7 from the eighth program state P8, a ninth read voltage R9 may distinguish the eight program state P8 from the ninth program state P9, a tenth read voltage R10 may distinguish the ninth program state P9 from the tenth program state P10, an eleventh read voltage R11 may distinguish the tenth program state P10 from the eleventh program state P11, a twelfth read voltage R12 may distinguish the eleventh program state P11 from the twelfth program state P12, a thirteenth read voltage R13 may distinguish the twelfth program state P12 from the thirteenth program state P13, a fourteenth read voltage R14 may distinguish the thirteenth program state P13 from the fourteenth program state P14, and a fifteenth read voltage R15 may distinguish the fourteenth program state P14 from the fifteenth program state P15.

Figure 11:
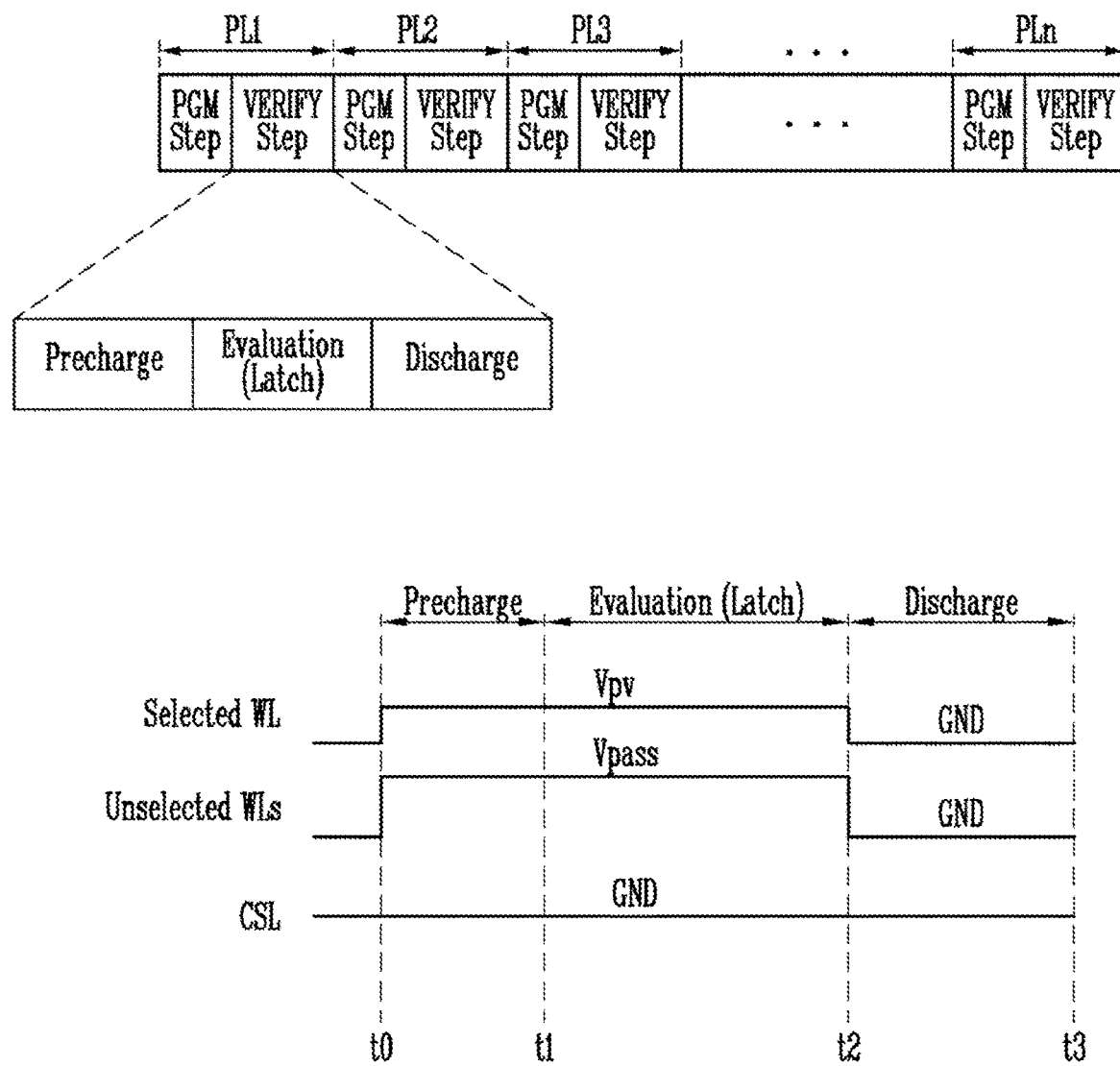
FIG. 11 is a detailed diagram illustrating a verify step of FIG. 6.

FIG. 11 is a detailed diagram illustrating a verify step of FIG. 6.

Referring to FIG. 11, a program operation of the memory device 100 may include the plurality of program loops PL1 to PLn. In other words, the memory device 100 may perform the plurality of program loops PL1 to PLn so that each of the memory cells may have one of the plurality of program states.

Each of the plurality of program loops PL1 to PLn may include a program voltage apply step (PGM Step) in which a program voltage is applied and a verify step (Verify step) in which verify voltages are applied to determine whether memory cells are programmed.

The verify step included in each of the program loops may include a precharge period, an evaluation period (Latch) and a discharge period.

During the precharge period, a page buffer coupled to a memory cell may precharge the bit line BL to a bit line voltage corresponding to a target program state of the memory cell coupled thereto through a sensing node SO coupled to the bit line BL.

For example, during a period t0 to t1, a precharge period, a verify voltage Vpv corresponding to a program state to verify may be applied to a selected word line Selected WL. A verify pass voltage Vpass for turning on memory cells may be applied to an unselected word line Unselected WL so that the memory cells coupled to the unselected word line Unselected WL may not affect a voltage of a bit line. A ground voltage GND corresponding to 0V may be applied to the common source line CSL.

During an evaluation period t1 to t2, a voltage of the bit line BL determined by a current flowing through the memory cell may be detected. The memory device 100 may store a state of the memory cell according to the voltage of the bit line BL. The status of the memory cell may correspond to a verify pass or a verify fail. When a threshold voltage of the memory cell is greater than a verify voltage applied to a word line, the memory cell may be read as an off-cell, and a status of the memory cell read as the off-cell may correspond to verify pass. On the other hand, when a threshold voltage of the memory cell is less than a verify voltage applied to a word line, the memory cell may be read as an on-cell, and a status of the memory cell read as the on-cell may correspond to verify fail.

During a discharge period t2 to t3, voltages applied to word lines and selection lines (not shown) may be discharged. The memory device may discharge voltages applied to word lines and selection lines (not shown) by applying a ground voltage corresponding to 0V to the word lines and the selection lines (not shown).

Figure 12:
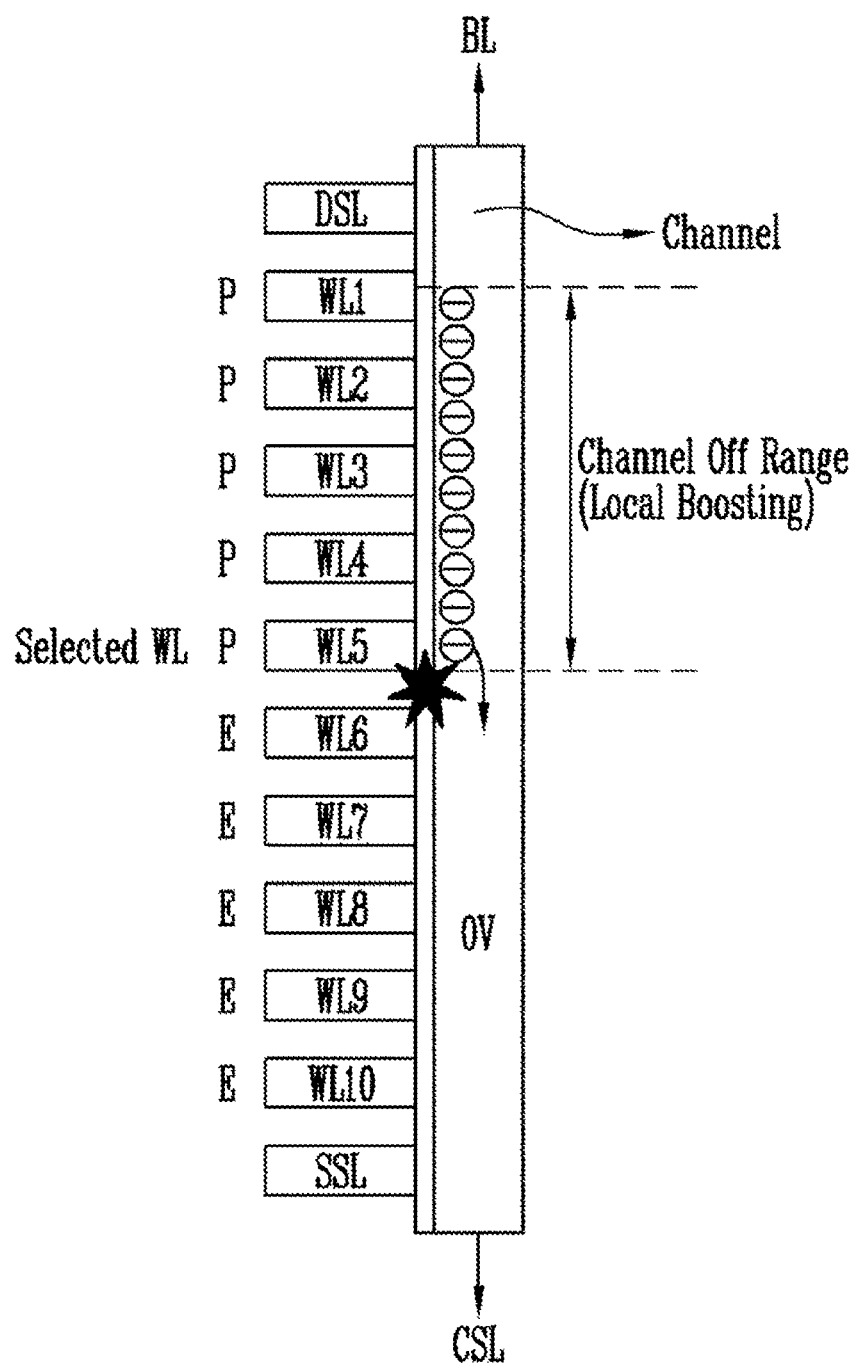
FIG. 12 is a diagram illustrating negative boosting.

FIG. 12 is a diagram illustrating negative boosting.

FIG. 12 shows an unselected memory cell string. A memory cell string may include a plurality of memory cells coupled in series between the bit line BL and the common source line CSL. Each of the memory cells may be coupled to word lines. A drain selection transistor may be coupled between the memory cells and the bit line BL and a source selection transistor may be coupled between the memory cells and the common source line CSL. The drain selection transistor may be controlled by a drain selection line and the source selection transistor may be controlled by a source selection line.

For convenience of explanation, it is assumed that the memory cell string is coupled to ten word lines WL1 to WL10 and a program operation is sequentially performed in a direction from the first word line WL1 to the tenth word line WL10. The selected word line may be a fifth word line WL5. Therefore, memory cells coupled to the first to fourth word lines WL1 to WL4 may be programmed memory cells, and memory cells coupled to sixth to tenth word lines WL6 to WL10 may be memory cells before being programmed. Accordingly, the memory cells coupled to the sixth to tenth word lines WL6 to WL10 may have threshold voltages corresponding to the erase state E. Thus, a channel-off period, i.e., a local boosting area may be formed in a channel corresponding to the memory cells coupled to the first to fifth word lines WL1 to WL5.

In the discharge period described above with reference to FIG. 11, the word lines may be discharged to a ground voltage. Therefore, charges of the channel-off period may undergo negative down-coupling. This is referred as to "negative boosting" or "under coupling". As a result, the number of negative charges included in the channel may increase.

A voltage of the channel corresponding to the memory cells coupled to the sixth to tenth word lines WL6 to WL10 may be a ground voltage (i.e., 0V). As a voltage difference between the negative voltage of the channel-off period and the ground voltage (0V) increases, memory cells corresponding to the erase state E may be programmed by band to band tunneling (BTBT) or hot carrier injection (HCI).

Therefore, according to an embodiment, a memory device preventing negative boosting by discharging word lines in two steps during a discharge period while charging a channel through a common source line or a bit line, and a method of operating the same are provided.

Hereinafter, a program operation method according to an embodiment will be described in with reference to FIGS. 13 to 16.

Figure 13:
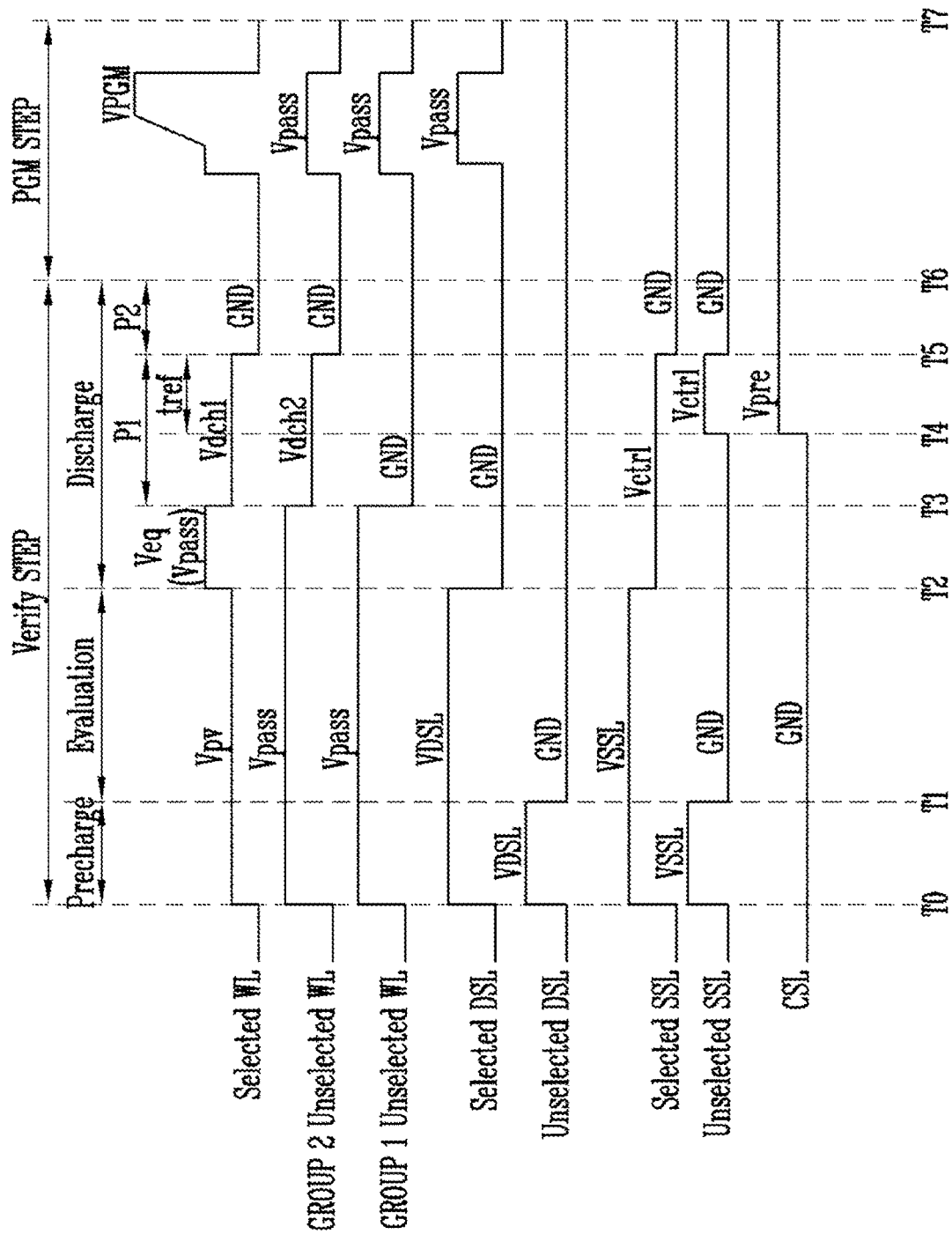
FIG. 13 is a waveform diagram illustrating a method of operating a memory device according to an embodiment.

FIG. 13 is a waveform diagram illustrating a method of operating a memory device according to an embodiment.

Referring to FIG. 13, T0 to T6 show a verify step included in a program operation and T6 to T7 show a program voltage apply step included in the program operation. The memory device may perform the program voltage apply step before T0.

The verify step may include a precharge period, an evaluation period, and a discharge period.

T0 to T1 may be the precharge period, T1 to T2 may be the evaluation period, and T2 to T6 may be the discharge period.

Memory cells may be sequentially programmed in a word line order. Therefore, memory cells coupled to word lines programmed before the selected word line Selected WL, among unselected word lines Unselected WL, may be programmed, and memory cells coupled to word lines to be programmed after the selected word line Selected WL may have threshold voltages corresponding to an erase state.

In FIG. 13, it is assumed that the memory device sequentially performs a program operation in a direction from the word line WL adjacent to the drain selection line DSL to the word line WL adjacent to the source selection line SSL. Therefore, memory cells coupled to the unselected word lines Unselected WL located between the selected word line Selected WL and the source selection line SSL may correspond to memory cells on which a program operation is not performed. In addition, memory cells coupled to the unselected word lines Unselected WL located between the selected word line Selected WL and the drain selection line DSL may correspond to memory cells on which the program operation is already performed.

In FIG. 13, a first unselected word line group GROUP 1 Unselected WL may include the unselected word lines Unselected WL located between the selected word line Selected WL and the source selection line SSL. A second unselected word line group GROUP 2 Unselected WL may include the unselected word lines Unselected WL located between the selected word line Selected WL and the drain selection line DSL.

Memory cells coupled to the first unselected word line group GROUP 1 Unselected WL may be in an erase state since the first unselected word line group GROUP 1 Unselected WL is programmed after the selected word line Selected WL. Memory cells coupled to the second unselected word line group GROUP 2 Unselected WL may be programmed to have threshold voltages corresponding to the stored data since the second unselected word line group GROUP 2 Unselected WL is programmed before the selected word line Selected WL.

In T0 to T1, the memory device may apply a verify voltage Vpv to the selected word line Selected WL and a verify pass voltage Vpass to the unselected word lines GROUP 1, 2 Unselected WL. The verify voltage Vpv may be applied to determine program states of selected memory cells. The verify pass voltage Vpass may turn on the memory cells coupled to the unselected word lines GROUP 1,2 Unselected WL so that these memory cells may not be affected by a voltage of a bit line.

A drain selection voltage VDSL for turning on a drain selection transistor may be applied to a selected drain selection line Selected DSL which is a drain selection line of a selected memory string. In addition, the drain selection voltage VDSL for turning on a drain selection transistor may be applied to an unselected drain selection line Unselected DSL which is a drain selection line of an unselected memory string. In this manner, a channel potential of the unselected string may be prevented from being excessively increased by the high-potential verify pass voltage Vpass applied to the unselected word lines Unselected WL.

A source selection voltage VSSL for turning on a source selection transistor may be applied to a selected source selection line Selected SSL which is a source selection line of a selected memory string. The source selection voltage VSSL for turning on a source selection transistor may be applied to an unselected source selection line Unselected SSL which is a source selection line of an unselected memory string. In this manner, a channel potential of the unselected string may be prevented from being excessively increased by the high-potential verify pass voltage Vpass applied to the unselected word lines Unselected WL.

A ground voltage may be applied to the common source line CSL.

At T1, the drain selection voltage VDSL and the source selection voltage VSSL being applied to the unselected drain selection line Unselected DSL and the unselected source selection line Unselected SSL may be discharged. For example, the memory device may apply a ground voltage having a ground voltage level to the unselected drain selection line Unselected DSL and the unselected source selection line Unselected SSL. In this manner, the unselected string may be separated from the bit line and the common source line CSL and be in a floating state.

At T2, the potential of the selected word line Selected WL may increase to an equalizing voltage Veq. The equalizing voltage Veq may have the same level as the verify pass voltage Vpass. According to an embodiment, at T2, the voltage applied to the selected word line Selected WL may have the same level as the voltage being applied to the unselected word lines GROUP 1,2 Unselected WL.

Capacitive coupling may occur between word lines due to narrow spaces between the word lines. In the discharge period, all word lines may be simultaneously discharged to a ground voltage corresponding to 0V or a predetermined voltage which is very low. Therefore, the capacitive coupling between the word lines may prevent a voltage of a predetermined word line from being stably discharged to a ground voltage level. In other words, the unselected word lines GROUP 1,2 Unselected WL may be slowly discharged due to RC delay and the selected word line Selected WL may be instantaneously reduced to a voltage level of a negative voltage below 0V due to capacitive coupling with the unselected word lines Unselected WL adjacent thereto.

Therefore, a more stable discharge may be allowed when the voltage of the selected word line Selected WL and is discharged after being adjusted to the same level as the voltage being applied to the unselected word lines GROUP 1,2 Unselected WL.

At T2, the selected drain selection line Selected DSL may be discharged to a ground voltage of 0V. A control voltage Vctrl1 may be applied to the selected source selection line Selected SSL.

During T3 to T5, a first discharge voltage Vdch1 may be applied to the selected word line Selected WL. The discharge voltage Vdch1 may be higher than 0V and lower than the equalizing voltage Veq.

During T3 to T5, a second discharge voltage Vdch2 may be applied to the second unselected word line group GROUP 2 Unselected WL. According to an embodiment, the second discharge voltage Vdch2 may have a lower level than the first discharge voltage Vdch1. According to an embodiment, the discharge voltage Vdch2 may have a minimum voltage level by which a precharge voltage Vpre applied to the common source line CSL may be transferred to a channel region at T4.

At T3, the voltage of the first unselected word line group GROUP 1 Unselected WL may be discharged to the ground voltage. In other words, 0V may be applied to the first unselected word line group GROUP 1 Unselected WL.

During T4 to T5, a channel voltage may be precharged through the common source line CSL.

For example, at T4, the control voltage Vctrl may be applied to the unselected source selection line Unselected SSL. In addition, the precharge voltage Vpre may be applied to the common source line CSL. According to an embodiment, the control voltage Vctrl may turn on the source selection transistor of the unselected string so that the precharge voltage Vpre applied to the common source line CSL may be transferred to the channel region. According to an embodiment, the control voltage Vctrl may have a higher level than the first discharge voltage Vdch1.

At T5, the selected word line Selected WL, the second unselected word line group GROUP 2 Unselected WL, the selected source selection line Selected SSL and the unselected source selection line Unselected SSL may be discharged to the ground voltage. In other words, the memory device may apply 0V to the selected word line Selected WL, the second unselected word line group GROUP 2 Unselected WL, the selected source selection line Selected SSL, and the unselected source selection line Unselected SSL.

According to the embodiment shown in FIG. 13, the memory device according to an embodiment may discharge voltages of the word lines in two steps during the discharge period of the verify step. In other words, the first discharge voltage Vdch1 and the second discharge voltage Vdch2 may be applied to the selected word line Selected WL and the second unselected word line group GROUP 2 Unselected WL during P1, and all word lines and selection lines may be discharged to the ground voltage of 0V during P2. In addition, during a predetermined reference time tref in the period P1, the control voltage Vctrl may be applied to the unselected source selection line Unselected SSL, and a precharge voltage may be applied to the common source line CSL. As a result, HCI caused by a voltage level difference in a channel may be prevented during negative boosting.

According to an embodiment, the time P1 during which the first discharge voltage Vdch1 and the second discharge voltage Vdch2 are applied to the selected word line Selected WL and the second unselected word line group GROUP 2 Unselected WL may increase as a program loop increases. Alternatively, the time P1 during which the first discharge voltage Vdch1 and the second discharge voltage Vdch2 are applied to the selected word line Selected WL and the second unselected word line group GROUP 2 Unselected WL may increase as the number of program pulses increases.

According to various embodiments, when a time during which the control voltage Vctrl is applied to the unselected source selection line Unselected SSL is the reference time tref, the reference time tref may increase as a program loop increases. Alternatively, the reference time tref may increase as the number of program pulses applied increases.

During T4 to T5, when the memory device precharges the channel voltage through the common source line, the precharge voltages Vpre may be transferred to a channel through the source line side. In addition, since the common source line CSL is coupled to the bit line BL through the channel, the precharge voltage Vpre may be transferred to the bit line through the channel.

Figure 14:
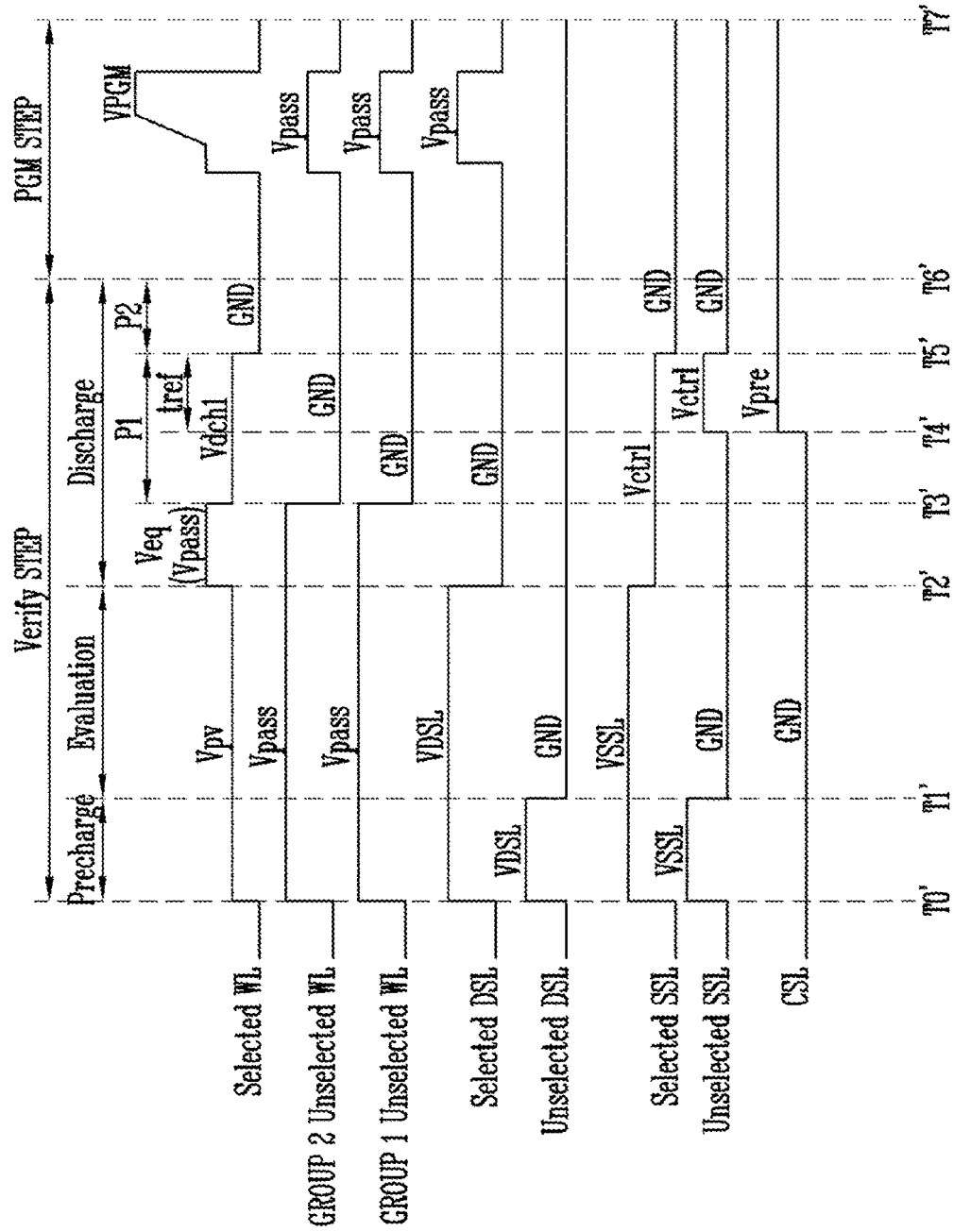
FIG. 14 is a waveform diagram illustrating a method of operating a memory device according to an embodiment.

FIG. 14 is a waveform diagram illustrating a method of operating a memory device according to an embodiment.

Referring to FIG. 14, T0' to T6' show a verify step included in a program operation and T6' to T7' show a program voltage apply step included in the program operation. The memory device may perform the program voltage apply step before T0'.

Operations during T0' to T3' and operations of the memory device during T4' to T7' as shown in FIG. 14 may be the same as the operations during the period T0 to T3 and the operations of the memory device during the period T4 to T7 as shown in FIG. 13.

The embodiment of FIG. 14 may be different from the embodiment of FIG. 13. Contrary to the embodiment FIG. 13, the second discharge voltage Vdch2 may not be applied to the second unselected word line group GROUP 2 Unselected WL and may be discharged to the ground voltage at T3' in the embodiment of FIG. 14. In other words, referring to the embodiment of FIG. 14, the memory device may not discharge the second unselected word line group GROUP 2 Unselected WL to the ground voltage via the second discharge voltage Vdch2 from the verify pass voltage Vpass. Instead, the memory device may discharge the second unselected word line group GROUP 2 Unselected WL together with the first unselected word line group GROUP 1 Unselected WL directly to the ground voltage from the verify pass voltage Vpass.

Figure 15:
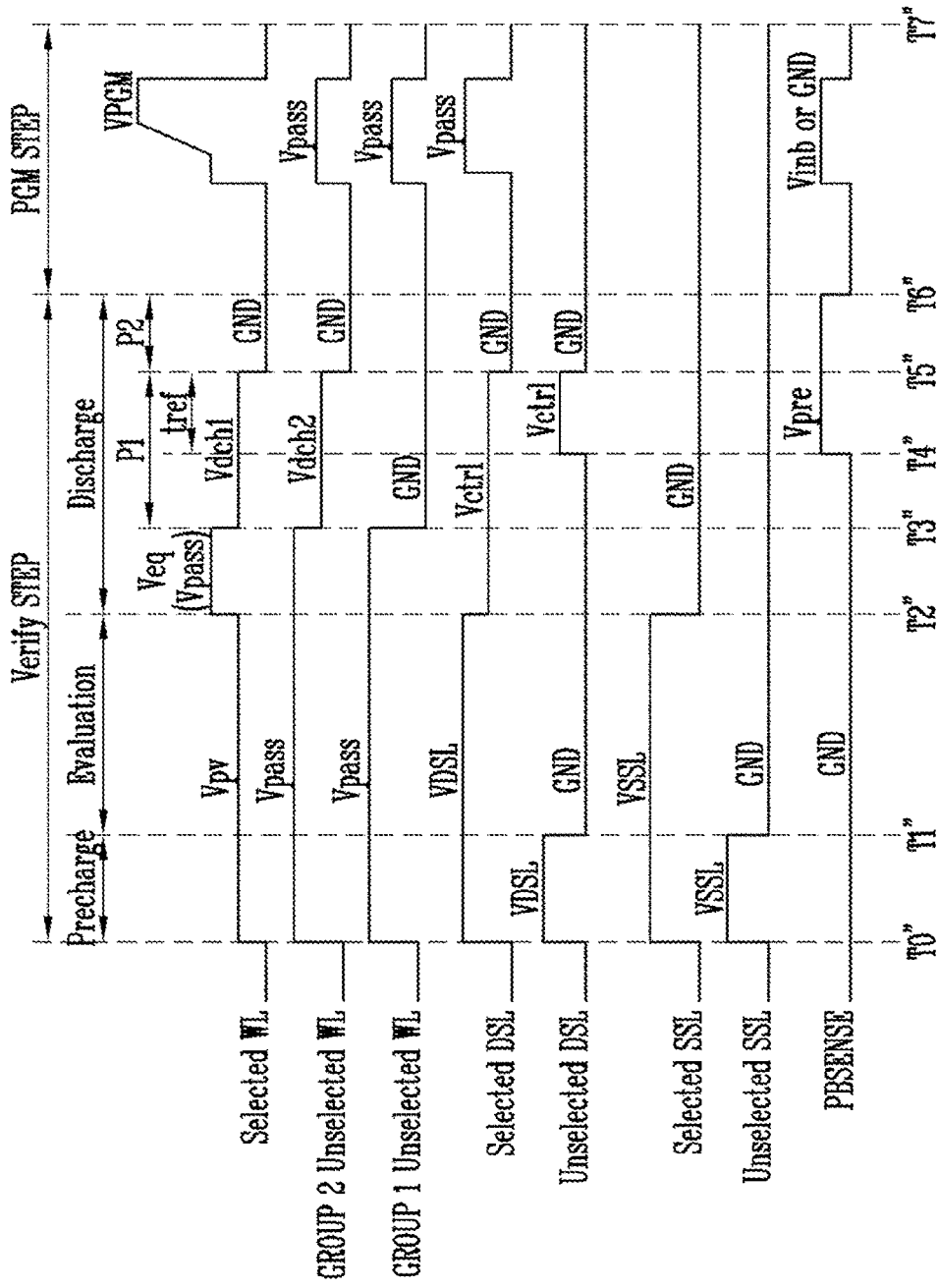
FIG. 15 is a waveform diagram illustrating a method of operating a memory device according to an embodiment.

FIG. 15 is a waveform diagram illustrating a method of operating a memory device according to an embodiment.

Referring to FIG. 15, T0" to T6" show a verify step included in a program operation and T6" to T7" show a program voltage apply step included in the program operation. The memory device may perform the program voltage apply step before T0".

The verify step may include a precharge period, an evaluation period and a discharge period.

T0" to T1" may be the precharge period, T1" to T2" may be the evaluation period, and T3" to T6" may be the discharge period.

Memory cells may be sequentially programmed in a word line order. Therefore, memory cells coupled to word lines programmed before the selected word line Selected WL, among the unselected word lines Unselected WL, may be programmed, and memory cells coupled to word lines to be programmed after the selected word line Selected WL may have threshold voltages corresponding to an erase state.

In FIG. 15, it is assumed that the memory device sequentially performs a program operation in a direction from the word line WL adjacent to the source selection line SSL to the word line WL adjacent to the drain selection line DSL. In other words, the embodiment of FIG. 15 shows that the memory cells are programmed in an opposite direction to the embodiments shown in FIGS. 13 and 14.

Therefore, memory cells coupled to the unselected word lines Unselected WL located between the selected word line Selected WL and the drain selection line DSL may have an erase state since the unselected word lines Unselected WL are programmed after the selected word line Selected WL. In addition, memory cells coupled to the unselected word lines Unselected WL located between the selected word line Selected WL and the source selection line SSL may be programmed to have threshold voltages corresponding to the stored data since the unselected word lines Unselected WL are programmed before the selected word line Selected WL.

In FIG. 15, the first unselected word line group GROUP 1 Unselected WL may include the unselected word lines Unselected WL located between the selected word line Selected WL and the drain selection line DSL. The second unselected word line group GROUP 2 Unselected WL may include the unselected word lines Unselected WL located between the selected word line Selected WL and the source selection line SSL.

Memory cells coupled to the first unselected word line group GROUP 1 Unselected WL may have an erase state and memory cells coupled to the second unselected word line group GROUP 2 Unselected WL may have a program state.

During T0" to T1", the memory device may apply the verify voltage Vpv to the selected word line Selected WL and may apply the verify pass voltage Vpass to the unselected word lines GROUP 1, 2 Unselected WL. The verify voltage Vpv may be applied to determine program states of selected memory cells. The verify pass voltage Vpass may turn on the memory cells coupled to the unselected word lines GROUP 1,2 Unselected WL so that these memory cells may not be affected by a voltage of a bit line.

The drain selection voltage VDSL for turning on a drain selection transistor may be applied to the selected drain selection line Selected DSL which is a drain selection line of a selected memory string. In addition, the drain selection voltage VDSL for turning on a drain selection transistor may be applied to the unselected drain selection line Selected DSL which is a drain selection line of an unselected memory string. In this manner, a channel potential of the unselected string may be prevented from being excessively increased by the high-potential verify pass voltage Vpass applied to the unselected word lines Unselected WL.

The source selection voltage VSSL for turning on a source selection transistor may be applied to the selected source selection line Selected SSL which is a source selection line of a selected memory string. The source selection voltage VSSL for turning on a source selection transistor may be applied to a selected source selection line Selected SSL which is a source selection line of an unselected memory string. In this manner, a channel potential of the unselected string may be prevented from being excessively increased by the high-potential verify pass voltage Vpass applied to the unselected word lines Unselected WL.

The ground voltage may be applied to the common source line CSL.

At T1", the drain selection voltage VDSL and the source selection voltage VSSL being applied to the unselected drain selection line Unselected DSL and the unselected source selection line Unselected SSL may be discharged. For example, the memory device may apply a ground voltage having a ground voltage level to the unselected drain selection line Unselected DSL and the unselected source selection line Unselected SSL. Thus, the unselected string may be separated from the bit line and the common source line CSL and be in a floating state.

At T2", the potential of the selected word line Selected WL may increase to the equalizing voltage Veq. The equalizing voltage Veq may have the same level as the verify pass voltage Vpass. Alternatively, according to an embodiment, at T2", the voltage applied to the selected word line Selected WL may have the same level as the voltage being applied to the unselected word lines GROUP 1,2 Unselected WL.

At T2", the selected source selection line Selected SSL may be discharged to a ground voltage of 0V. The control voltage Vctrl1 may be applied to the selected drain selection line Selected DSL.

During T3" to T5", the first discharge voltage Vdch1 may be applied to the selected word line Selected WL. The discharge voltage Vdch1 may be higher than 0V and lower than the equalizing voltage Veq.

During T3" to T5", the second discharge voltage Vdch2 may be applied to the second unselected word line group GROUP 2 Unselected WL. According to an embodiment, the second discharge voltage Vdch2 may have a lower level than the first discharge voltage Vdch1. According to an embodiment, the discharge voltage Vdch2 may have a minimum voltage level by which the precharge voltage Vpre applied to the common source line CSL may be transferred to a channel region at T4".

At T3", the voltage of the first unselected word line group GROUP 1 Unselected WL may be discharged to the ground voltage GND. In other words, 0V may be applied to the first unselected word line group GROUP 1 Unselected WL.

During T4" to T5", the channel voltage may be precharged through the bit line.

For example, the control voltage Vctrl1 may be applied to the unselected drain selection line Unselected DSL at T4". In addition, the precharge voltage Vpre may be applied to the bit line BL according to a control signal PBSENSE. According to an embodiment, the control voltage Vctrl1 may turn on the drain selection transistor of the unselected string so that the precharge voltage Vpre applied to the bit line BL may be transferred to the channel region. According to an embodiment, the control voltage Vctrl1 may have a higher level than the first discharge voltage Vdch1.

At T5", the selected word line Selected WL, the second unselected word line group GROUP 2 Unselected WL, the selected source selection line Selected SSL and the unselected source selection line Unselected SSL may be discharged to the ground voltage. In other words, the memory device may apply 0V to the selected word line Selected WL, the second unselected word line group GROUP 2 Unselected WL, the selected drain selection line Selected DSL, and the unselected drain selection line Unselected DSL.

According to the embodiment shown in FIG. 15, the memory device according to an embodiment may discharge voltages of the word lines in two steps during the discharge period of the verify step. In other words, the first discharge voltage Vdch1 and the second discharge voltage Vdch2 may be applied to the selected word line Selected WL and the second unselected word line group GROUP 2 Unselected WL during P1, and all word lines and selection lines may be discharged to the ground voltage of 0V during P2. In addition, during the predetermined reference time tref in the period P1, the control voltage Vctrl1 may be applied to the unselected drain selection line Unselected DSL, and a precharge voltage may be applied to the bit line BL. As a result, HCI caused by a voltage level difference in a channel may be prevented during negative boosting.

According to an embodiment, the time (P1) during which the first discharge voltage Vdch1 and the second discharge voltage Vdch2 are applied to the selected word line Selected WL and the second unselected word line group GROUP 2 Unselected WL may increase as a program loop increases. Alternatively, the time P1 during which the first discharge voltage Vdch1 and the second discharge voltage Vdch2 are applied to the selected word line Selected WL and the second unselected word line group GROUP 2 Unselected WL may increase as the number of program pulses increases.

According to various embodiments, when a time during which the control voltage Vctrl1 is applied to the unselected drain selection line Unselected DSL is the reference time tref, the reference time tref may increase as a program loop increases. Alternatively, the reference time tref may increase as the number of program pulses applied increases.

Figure 16:
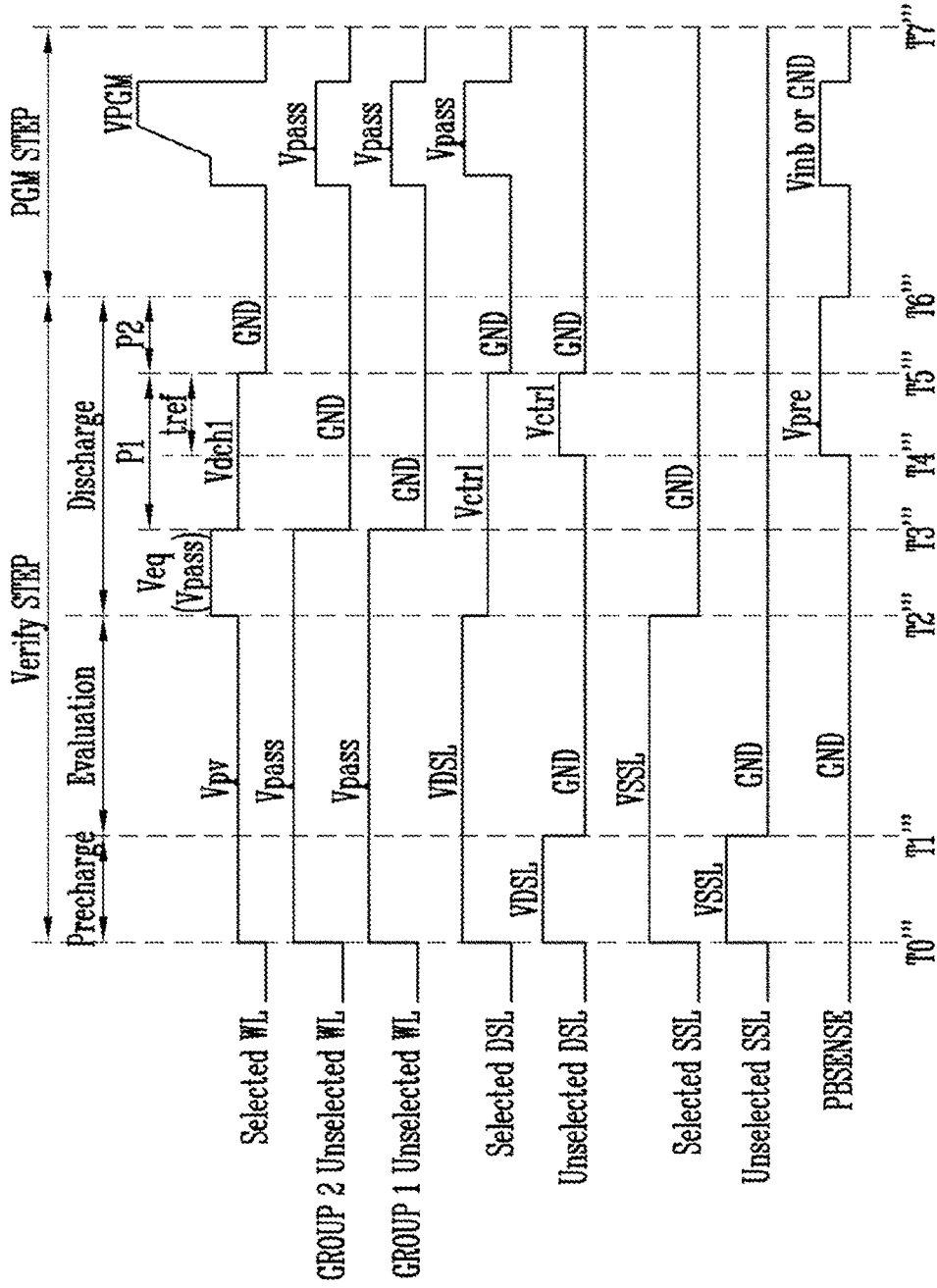
FIG. 16 is a waveform diagram illustrating a method of operating a memory device according to an embodiment.

FIG. 16 is a waveform diagram illustrating a method of operating a memory device according to an embodiment.

Referring to FIG. 16, T0'" to T6'" show a verify step included in a program operation and T6'" to T7'" show a program voltage apply step included in the program operation. The memory device may perform the program voltage apply step before T0'".

Operations during T0''' to T3''' and operations of the memory device during T4''' to T7''' as shown in FIG. 16 may be the same as the operations during the period T0'' to T3'' and the operations of the memory device during the period T4'' to T7'' as shown in FIG. 15, except for T4'' to T5'' for the second unselected word line group GROUP 2 Unselected WL.

The embodiment of FIG. 16 may be different from the embodiment of FIG. 15. Contrary to the embodiment FIG. 15, the second discharge voltage Vdch2 may not be applied to the second unselected word line group GROUP 2 Unselected WL and may be discharged to the ground voltage at T3'' in the embodiment of FIG. 16. In other words, referring to the embodiment of FIG. 16, the memory device may not discharge the second unselected word line group GROUP 2 Unselected WL to the ground voltage via the second discharge voltage Vdch2 from the verify pass voltage Vpass. The memory device may discharge the second unselected word line group GROUP 2 Unselected WL together with the first unselected word line group GROUP 1 Unselected WL from the verify pass voltage Vpass directly to the ground voltage.

Figure 17:
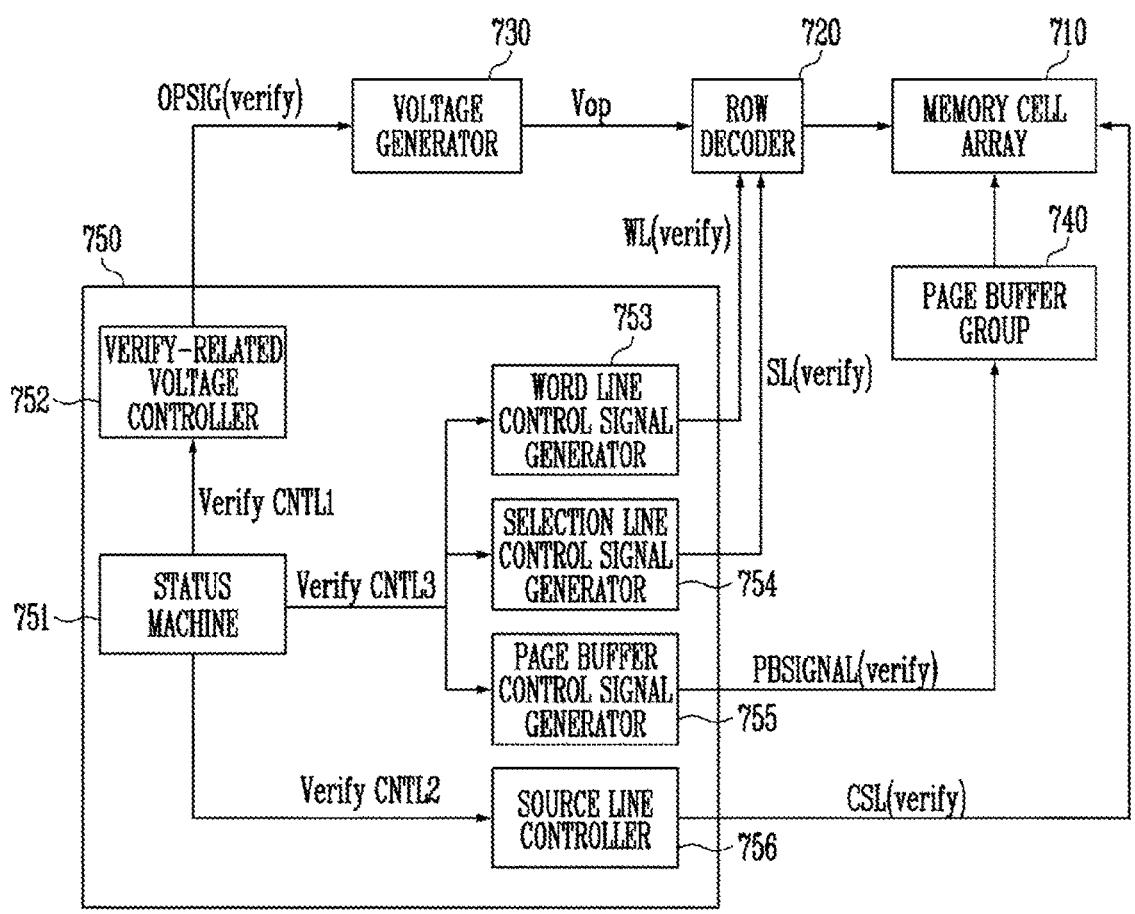
FIG. 17 is a block diagram illustrating the configuration of a program operation controller included in a control logic of FIG. 2.

FIG. 17 is a block diagram illustrating the configuration of a program operation controller 750 included in the control logic 120 of FIG. 2.

As shown in FIG. 17, the memory device 100 may include a memory cell array 710, a row decoder 720, a voltage generator 730, a page buffer group 740, and the program operation controller 750. Operations of the program operation controller 750 will be mainly described since the memory cell array 710, the row decoder 720, the voltage generator 730, and the page buffer group 740 are configured and operated in the same manner as the memory cell array 110, the row decoder 121, the voltage generator 122, and the page buffer group 123 described above with reference 2.

The program operation controller 750 may be included in the control logic 130 described above with reference to FIG. 2.

Referring to FIG. 17, the program operation controller 750 may include a status machine 751, a verify-related voltage controller 752, a word line control signal generator 753, a selection line control signal generator 754, a page buffer control signal generator 755, and a source line controller 756.

The status machine 751 may generate verify control signals for controlling peripheral circuits to perform a verify step according to a program command input from a memory controller controlling the memory device. For example, the status machine 751 may provide a first verify control signal Verify CNTL1 for generating verify-related voltages having various levels used in the verify step to the verify-related voltage controller 752. The verify-related voltage controller 752 may generate a verify operation signal OPSIG(verify) for controlling the voltage generator 730 and provide the generated verify operation signal OPSIG(verify) to the voltage generator 730 in response to the first verify control signal Verify CNTL1. The voltage generator 730 may generate various verify related voltages Vop used in the verify step and provide the generated verify-related voltages Vop to the row decoder 720 in response to the verify operation signal OPSIG(verify).

According to an embodiment, the status machine 751 may generate a second verify control signal Verify CNTL2 for controlling the timing when a precharge voltage is applied to a common source line during a discharge period of the verify step, and may provide the generated second verify control signal Verify CNTL2 to the source line controller 756.

The source line controller 756 may apply a precharge voltage CSL(verify) to the common source line of the memory cell array 710 in response to the second verify control signal Verify CNTL2.

According to an embodiment, the status machine 751 may generate a third verify control signal Verify CNTL3 for controlling the timing at which a verify-related voltage Vop applied to row lines and bit lines coupled to the memory cell array 710, and may provide the generated third verify control signal Verify CNTL3 to the word line control signal generator 753, the selection line control signal generator 754, and the page buffer control signal generator 755.

The word line control signal generator 753 and the selection line control signal generator 754 may provide a word line control signal WL(verify) and a selection line control signal SL(verify) to the row decoder in response to the third control verify control signal Verify CNTL3. The row decoder 720 may provide the verify-related voltages Vop generated by the voltage generator 730 to the memory cell array 710 at a timing determined by the word line control signal WL(verify) and the selection line control signal SL(verify).

The page buffer control signal generator 755 may provide a page buffer control signal PBSIGNAL(verify) for controlling the page buffer group to the page buffer group 740 in response to the third verify control signal Verify CNTL3. The page buffer group 740 may provide a voltage to bit lines coupled to the memory cell array 710 according to the page buffer control signal PBSIGNAL(verify).

Figure 18:
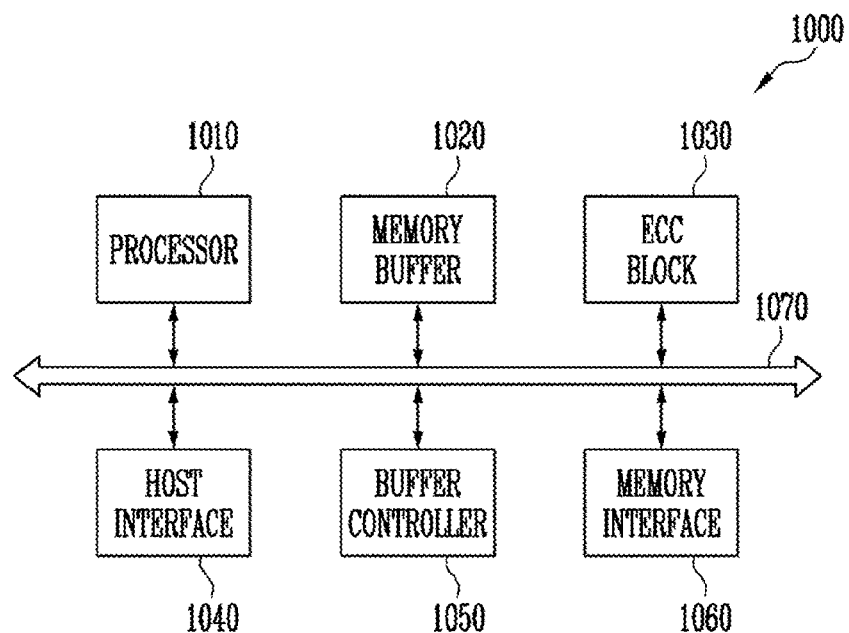
FIG. 18 is a diagram illustrating other embodiments of a memory controller of FIG. 1.

FIG. 18 is a diagram illustrating an embodiment of the memory controller 200 of FIG. 1.

A memory controller 1000 may be coupled to a host and a memory device. In response to a request from the host, the memory controller 1000 may access the memory device. For example, the memory controller 1000 may be configured to control write, read, erase, and background operations of the memory device. The memory controller 1000 may provide an interface between the memory device and the host. The memory controller 1000 may be configured to drive firmware for controlling the memory device.

Referring to FIG. 18, the memory controller 1000 may include a processor 1010, a memory buffer 1020, an error correction code (ECC) block 1030, a host interface 1040, a buffer control circuit 1050 (buffer controller), a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The flash translation layer FTL may receive the logical block address LBA and translate the logical block address LBA into the physical block address PBA by using a mapping table. There may be various address mapping methods for the flash translation layer FTL, depending on a mapping unit. Typical address mapping methods may include a page mapping method, a block mapping method and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

According to an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 may not include the memory buffer 1020 and the buffer control circuit 1050.

For example, the processor 1010 may control the operations of the memory controller 1000 using codes. The processor 1010 may load codes from a non-volatile memory device (e.g., read only memory) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 19:
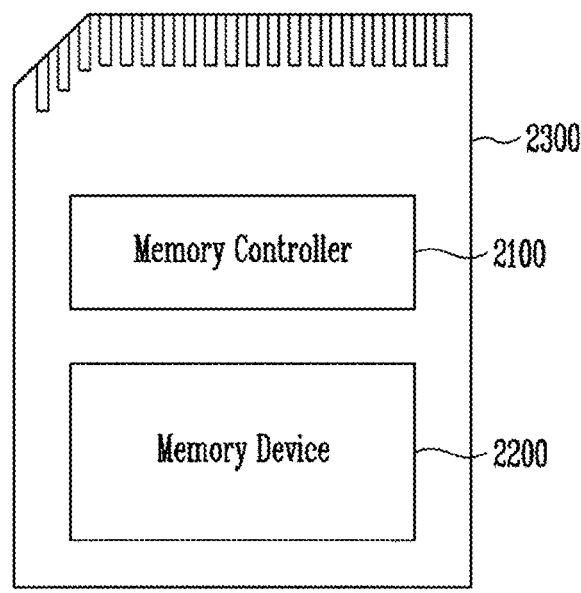
FIG. 19 is a block diagram illustrating a memory card system to which a storage device according to an embodiment is applied.

FIG. 19 is a block diagram illustrating a memory card system to which a storage device according to an embodiment is applied.

Referring to FIG. 19, a memory card system 2000 may include a memory controller 2100, a memory device 2200, and a connector 2300.

The controller 2100 may be coupled to the memory device 2200. The controller 2100 may access the memory device 2200. For example, the memory controller 2100 may be control read, write, erase, and background operations of the memory device 2200. The memory controller 2100 may be configured to provide an interface between the memory device 2200 and the host. The memory controller 2100 may be configured to drive firmware for controlling the memory device 2200. The memory controller 2200 may be configured in the same manner as the memory controller 100 as described above with reference to FIG. 2.

In an embodiment, the controller 2100 may include components, such as a Random Access Memory (RAM), a processing unit, a host interface, a memory interface, and an ECC block.

The memory controller 2100 may communicate with an external device through the connector 2300. The controller 2100 may communicate with an external device (e g, a host) based on a specific communication protocol. In an embodiment, the controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

Figure 20:
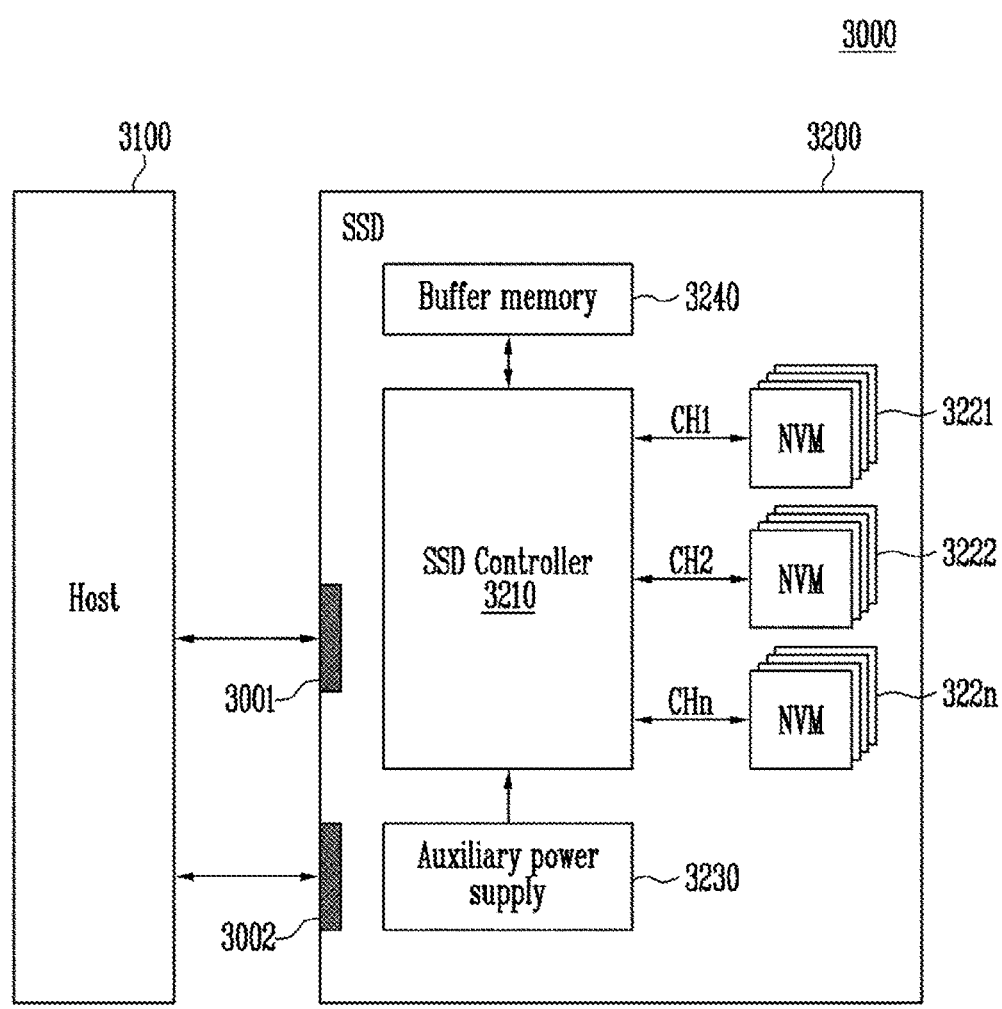
FIG. 20 is a block diagram illustrating an example of a solid state drive (SSD) system to which a storage device according to an embodiment is applied.

FIG. 20 is a block diagram illustrating an example of a solid state drive (SSD) system to which a storage device according to an embodiment is applied.

Referring FIG. 20, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 as described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n or may temporarily store metadata (e g, mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-M RAM, and PRAM.

Figure 21:
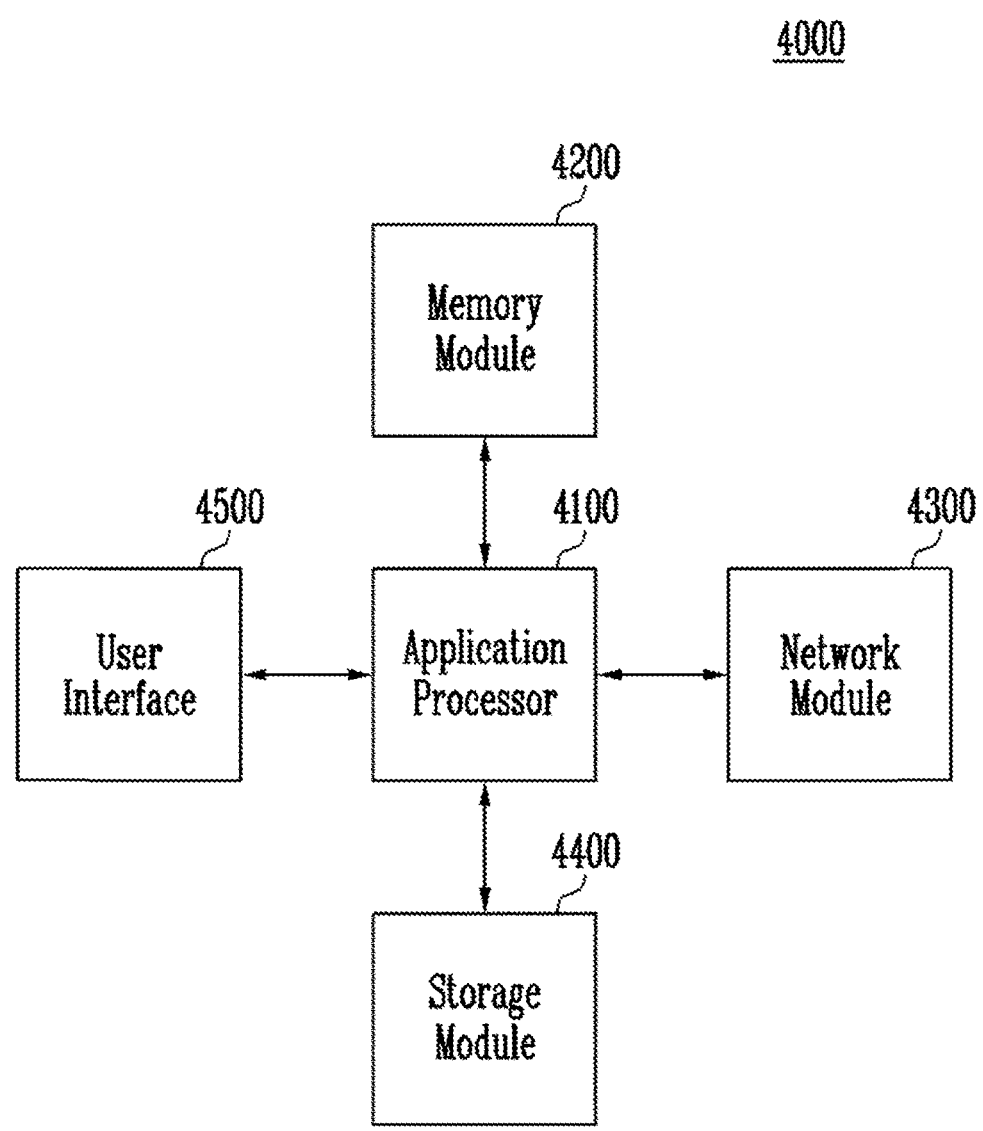
FIG. 21 is a block diagram illustrating a user system to which a storage device according to an embodiment is applied.

FIG. 21 is a block diagram illustrating a user system to which a storage device according to an embodiment is applied.

Referring to FIG. 21, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and the plurality of nonvolatile memory devices may be operated in the same way as the memory device as described above with reference to FIGS. 2 to 5. The storage module 4400 may be operated in the same way as the storage device 50 as described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

According to the present disclosure, a memory device having an improved program operation speed and an operating method thereof are provided.

It will be apparent to those skilled in the art that various modifications can be made to the above-described examples of embodiments without departing from the spirit or scope of the disclosure. Thus, it is intended that the present embodiments cover all such modifications provided they come within the scope of the appended claims and their equivalents.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic concepts described herein will still fall within the spirit and scope of the present disclosure as defined in the accompanying claims and equivalents thereof.

What is claimed is:

1. A method of operating a memory device including a plurality of memory cell strings each including a plurality of memory cells coupled between a common source line and a bit line, a source selection line coupled between the common source line and the plurality of memory cells, and a drain selection line coupled between the bit line and the plurality of memory cells, the method comprising:
   matching a voltage of a selected word line, among word lines coupled to the plurality of memory cells, with a voltage of unselected word lines; and
   precharging a channel region of the plurality of memory cell strings through the common source line while discharging the selected word line and the unselected word lines.

2. The method of claim 1, wherein the matching of the voltages comprises:
   applying an equalizing voltage to the selected word line, the equalizing voltage having a same level as a voltage applied to the unselected word lines; and
   discharging a drain selection line of a selected memory cell string, among the plurality of memory cell strings.

3. The method of claim 2, wherein the equalizing voltage turns on memory cells coupled to the unselected word lines.

4. The method of claim 2, wherein the matching of the voltages further comprises applying a control voltage to a source selection line of the selected memory cell string.

5. The method of claim 4, wherein the control voltage has a minimum voltage level by which a source selection transistor coupled to unselected memory cell strings, among the plurality of memory cell strings, is turned on to transfer a precharge voltage applied through the common source line to the channel region of the plurality of memory cell strings.

6. The method of claim 1, wherein the precharging of the channel region comprises:
   applying a first discharge voltage to the selected word line and applying a second discharge voltage to a first unselected word line group located between the selected word line and the drain selection line, among the unselected word lines; and
   applying a ground voltage to a second unselected word line group including unselected word lines located between the selected word line and the source selection line while applying the first discharge voltage and the second discharge voltage.

7. The method of claim 6, wherein the precharging of the channel region further comprises applying a control voltage to a source selection line of unselected memory cell strings, among the plurality of memory cell strings, for a predetermined reference time, while the first discharge voltage and the second discharge voltage are applied to the selected word line and the first unselected word line group, respectively.

8. The method of claim 7, wherein the first discharge voltage has a greater voltage level than the second discharge voltage.

9. The method of claim 7, wherein the control voltage has a greater voltage level than the first discharge voltage.

10. The method of claim 6, wherein the precharging of the channel region further comprises applying a precharge voltage to the common source line while applying a control voltage to the source selection line of the unselected memory cell strings.

11. The method of claim 10, wherein the second discharge voltage has a minimum voltage level by which the precharge voltage is transferred to the channel region.

12. The method of claim 10, wherein the precharging of the channel region further comprises setting a bit line voltage according to data to be stored in memory cells coupled to the selected word line while applying the precharge voltage to the common source line.

13. The method of claim 1, wherein the precharging of the channel region further comprises:
   applying a first discharge voltage to the selected word line and applying a ground voltage to the unselected word lines;
   applying a control voltage to a source selection line of unselected memory cell strings, among the plurality of memory cell strings, for a predetermined reference time while applying the first discharge voltage to the selected word line; and
   applying a precharge voltage to the common source line while applying the control voltage to the source selection line of the unselected memory cell strings.

14. The method of claim 1, wherein the precharging of the channel region further comprises:
   applying a first discharge voltage to the selected word line and applying a second discharge voltage to unselected word lines on which a program operation is to be performed, among the unselected word lines; and
   applying a ground voltage to unselected word lines on which a program operation is performed, among the unselected word lines, while applying the first discharge voltage and the second discharge voltage.

15. The method of claim 14, wherein the precharging of the channel region comprises:
   applying a control voltage to one of a drain selection line and a source selection line of unselected memory cell strings, among the plurality of memory cell strings, for a predetermined reference time while the first discharge voltage and the second discharge voltage are applied to the selected word line and the unselected word lines on which the program operation is to be performed; and
   applying a precharge voltage to one of the common source line and the bit line while applying the control voltage to one of the drain selection line and the source selection line of the unselected memory cell strings.

16. The method of claim 15, wherein the reference time increases in length as a number of times a program voltage is applied to memory cells coupled to the selected word line increases.

17. A memory device, comprising:
   a plurality of memory cell strings each including a plurality of memory cells coupled between a common source line and a bit line, a source selection line coupled between the common source line and the plurality of memory cells, and a drain selection line coupled between the bit line and the plurality of memory cells;
   a peripheral circuit configured to perform a plurality of program loops including a program voltage apply step for applying a program voltage to selected memory cells, among the plurality of memory cells, and a verify step for verifying program states of the selected memory cells; and
   a program operation controller configured to control the peripheral circuit to apply a precharge voltage to a channel region of the plurality of memory cell strings through the common source line or the bit line when a selected word line coupled to the selected memory cells and a plurality of unselected word lines coupled to unselected memory cells are discharged in the verify step,
   wherein the unselected memory cells include all of the memory cells except for the selected memory cells.

18. The memory device of claim 17, wherein the program operation controller comprises:
- a status machine configured to generate a verify control signal for controlling the peripheral circuit to perform the verify step according to a program command input from the memory controller configured for controlling the memory device; and
- a verify-related voltage controller configured to generate a verify operation signal for instructing generation of a plurality of voltages used in the verify step in response to the verify control signal.

19. The memory device of claim 18, wherein the program operation controller further comprises a source line controller configured for controlling the precharge voltage to be applied to the common source line.

20. The memory device of claim 19, wherein the program operation controller further comprises:
- a word line control signal generator configured to control a voltage applied to the selected word line and the plurality of unselected word lines;
- a selection line control signal generator configured to control voltages applied to the source selection line and the drain selection line; and
- a page buffer control signal generator configured to control a voltage to be applied to the bit line.

* * * * *